(12) United States Patent
Huang et al.

(10) Patent No.: US 12,002,766 B2
(45) Date of Patent: Jun. 4, 2024

(54) SEMICONDUCTOR STRUCTURE HAVING ISOLATIONS BETWEEN FINS AND COMPRISING MATERIALS WITH DIFFERENT THERMAL EXPANSION COEFFICIENTS (CTE)

(71) Applicant: TAIWAN SEMICONDUCTOR MANUFACTURING COMPANY LTD., Hsinchu (TW)

(72) Inventors: Yuan-Sheng Huang, Taichung (TW); Ryan Chia-Jen Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/996,834

(22) Filed: Aug. 18, 2020

(65) Prior Publication Data
US 2022/0059471 A1 Feb. 24, 2022

(51) Int. Cl.
*H01L 29/66* (2006.01)
*H01L 21/762* (2006.01)
(Continued)

(52) U.S. Cl.
CPC ...... *H01L 23/562* (2013.01); *H01L 21/76224* (2013.01); *H01L 21/76229* (2013.01);
(Continued)

(58) Field of Classification Search
CPC ..... H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 21/76224; H01L 21/76229; H01L 21/76232;
(Continued)

(56) References Cited

U.S. PATENT DOCUMENTS 8,836,016 B2 * 9/2014 Wu ................... H01L 21/02658
257/E29.267
8,841,701 B2 9/2014 Lin et al.
(Continued)

OTHER PUBLICATIONS

WayBack Machine archive webpage capture, "Coefficient of Thermal Expansion (CTE)", Dec. 11, 2017.*

*Primary Examiner* — Younes Boulghassoul
(74) *Attorney, Agent, or Firm* — WPAT LAW; Anthony King

(57) ABSTRACT

A semiconductor structure and method for manufacturing the same are provided. The semiconductor structure includes a substrate having fin structures. The substrate includes a material having a substrate thermal expansion coefficient. The semiconductor structure also includes an isolation structure between the fin structures. The isolation structure includes a first dielectric material and a second dielectric material. The first dielectric material has a first thermal expansion coefficient and the second dielectric material has a second thermal expansion coefficient. The substrate thermal expansion coefficient is in between the first thermal expansion coefficient and the second thermal expansion coefficient.

20 Claims, 23 Drawing Sheets

(51) Int. Cl.
*H01L 21/8234* (2006.01)
*H01L 23/00* (2006.01)
*H01L 27/088* (2006.01)
*H01L 29/06* (2006.01)
*H01L 29/78* (2006.01)

(52) U.S. Cl.
CPC ........... *H01L 21/823431* (2013.01); *H01L 21/823481* (2013.01); *H01L 27/0886* (2013.01); *H01L 29/0649* (2013.01); *H01L 29/66795* (2013.01); *H01L 29/7851* (2013.01)

(58) Field of Classification Search
CPC ..... H01L 21/823481; H01L 21/823878; H01L 29/0649; H01L 29/0653; H01L 29/78696; H01L 29/42392; H01L 29/0673; H01L 29/66439; H01L 29/775; H01L 29/6681; H01L 29/7846
See application file for complete search history.

(56) References Cited

U.S. PATENT DOCUMENTS

| | | | |
|---|---|---|---|
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,455,204 B1 * | 9/2016 | Cao | H01L 21/823878 |
| 9,520,482 B1 | 12/2016 | Chang et al. | |
| 9,576,814 B2 | 2/2017 | Wu et al. | |
| 9,691,765 B1 * | 6/2017 | Bi | H01L 27/0207 |
| 10,276,449 B1 * | 4/2019 | Wu | H01L 21/823431 |
| 2015/0200127 A1 * | 7/2015 | Chuang | H01L 29/0642 438/424 |
| 2016/0351565 A1 * | 12/2016 | Sung | H01L 29/7846 |
| 2019/0097056 A1 * | 3/2019 | Kuo | H01L 27/1211 |
| 2019/0131186 A1 * | 5/2019 | Chung | H01L 21/76224 |
| 2019/0157156 A1 * | 5/2019 | Chen | H01L 21/76224 |
| 2019/0164848 A1 * | 5/2019 | Chung | H01L 21/02252 |
| 2019/0287971 A1 * | 9/2019 | Lee | H01L 29/66795 |
| 2020/0020569 A1 * | 1/2020 | Lin | H01L 29/66795 |
| 2020/0052081 A1 * | 2/2020 | Chung | H01L 29/41791 |
| 2020/0066718 A1 * | 2/2020 | Li | H01L 29/6681 |
| 2020/0105535 A1 * | 4/2020 | Lin | H01L 21/823431 |
| 2020/0105583 A1 * | 4/2020 | Wang | H01L 27/0886 |
| 2020/0105589 A1 * | 4/2020 | Tsai | H01L 29/66795 |
| 2020/0135580 A1 * | 4/2020 | Hsieh | H01L 21/31053 |
| 2020/0135587 A1 * | 4/2020 | Cheng | H01L 21/823878 |
| 2020/0357703 A1 * | 11/2020 | Lee | H01L 27/092 |

* cited by examiner

SEMICONDUCTOR STRUCTURE HAVING ISOLATIONS BETWEEN FINS AND COMPRISING MATERIALS WITH DIFFERENT THERMAL EXPANSION COEFFICIENTS (CTE)

BACKGROUND

The semiconductor integrated circuit (IC) industry has been undergoing rapid development and growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three-dimensional transistor, such as a fin-type field-effect transistor (FinFET), has been introduced to replace a planar transistor. As semiconductor devices are being scaled down to even smaller technology nodes, FinFET devices and methods for manufacturing FinFET devices still need to be optimized in order to achieve higher yield and better performance of the devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
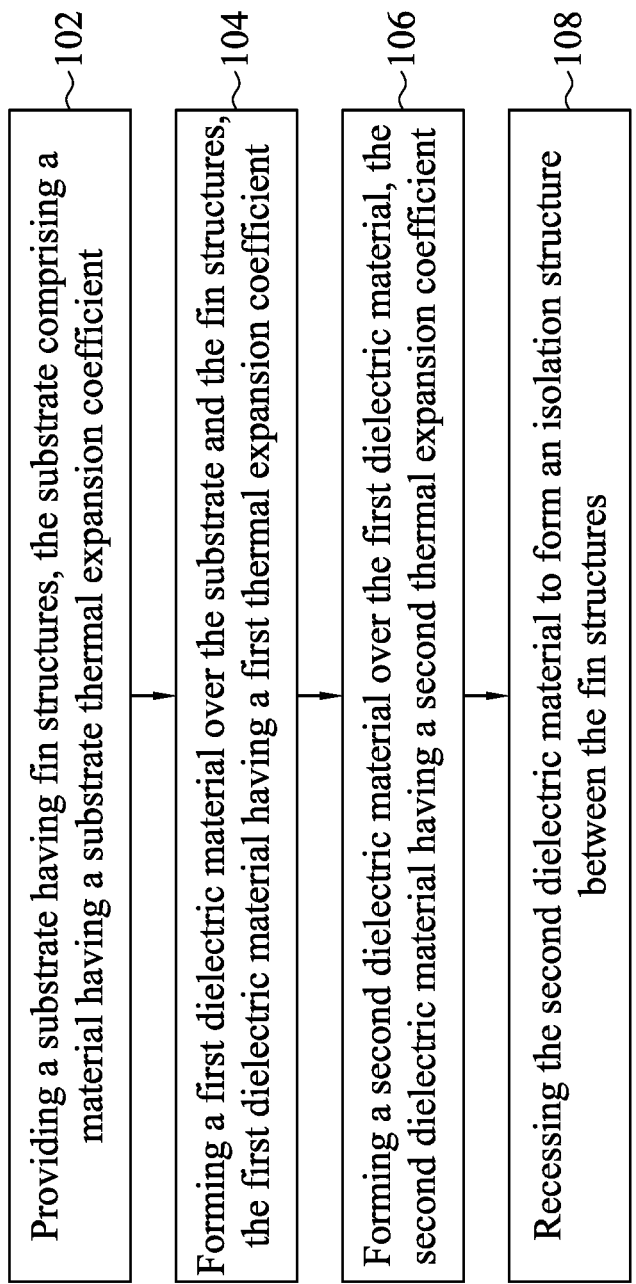
FIG. 1 is a flowchart representing a method for forming a semiconductor structure according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence, order, or importance unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally means within a value or range can be contemplated by people having ordinary skill in the art. Alternatively, the terms "substantially," "approximately" or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another end point or between two endpoints. All ranges disclosed herein are inclusive of the endpoints, unless specified otherwise.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In some embodiments, a semiconductor structure includes a substrate having fin structures and isolation structures, such as shallow trench isolation (STI) structures, between the fin structures. The isolation structures may have variant depths. That is, one of the isolation structures may have a depth different from another of the isolation structures. During an operation of thermal treatment (e.g., annealing the materials of the isolation structures), thermal stress is induced in such semiconductor structure due to different extents of thermal expansion of the substrate and the isolation structures. The thermal stress causes the fin structures to bend or incline from a vertical orientation, leading to the so-called "fin bending" issue.

The fin bending is resulted from the difference in thermal expansion coefficient between the material of the substrate and the material of the isolation structures. For example, the substrate may be made of silicon (Si) which has a thermal expansion coefficient of $2.5 \times 10^{-6}$ $K^{-1}$, and the isolation structures may be made of silicon oxide which has a thermal expansion coefficient of $0.5 \times 10^{-1}$. During an operation of thermal treatment such as a high-temperature annealing operation, the substrate made of Si expands to a larger extent than the isolation structure made of silicon oxide, thereby inducing thermal stress in the semiconductor structure which causes the fin structures to deviate from a vertical orientation. The fin bending is even more severe for a semiconductor structure that includes isolation structures of different depths. The fin bending may cause a lot of problems for subsequent operations. For example, voids may be formed during the subsequent deposition operation or residues may be left during the subsequent removal operation. Thus, the fin bending severely impacts the yield and/or performance of a semiconductor device. Such fin bending becomes even worse as technology nodes achieve progressive smaller scales where fin structures have a smaller width and spacing and a greater height.

Some other embodiments of a semiconductor structure and a manufacturing method thereof are therefore provided to further alleviate fin bending issue. The semiconductor structure includes a composite isolation structure between the fin structures on a substrate in accordance with the embodiments. In some embodiments, the composite isolation structure comprises two or more materials suitable for isolation, such as dielectric materials. Two of the materials of the composite isolation structure are selected to match the thermal expansion coefficient of the substrate. By way of example, the thermal expansion coefficient of the substrate is in between the thermal expansion coefficients of the two materials of the composite isolation structure. Accordingly, thermal stress can be balanced during an operation of thermal treatment and the fin bending can be avoided or at least mitigated. As a result, the semiconductor structure and the method for forming the same according to the embodiments can improve the yield and/or performance of a semiconductor device.

FIG. 1 is a flowchart representing a method for forming a semiconductor structure according to aspects of the present disclosure. The method for forming a semiconductor structure 10 includes an operation 102 where a substrate is provided with fin structures. The substrate comprises a material having a substrate thermal expansion coefficient. In some embodiments, the fin structures have two or more various spacings and/or two or more various depths. The method 10 further includes an operation 104 where a first dielectric material is formed over the substrate and the fin structures. The first dielectric material has a first thermal expansion coefficient. In some embodiments, before the operation 104, an additional operation is implemented where a dielectric liner is formed over the substrate and the fin structures. In some embodiments, the operation 104 includes filling up a space between the fin structures with the first dielectric material. In some alternative embodiments, the operation 104 includes forming the first dielectric material conformally over the substrate and the fin structures. The method 10 further includes an operation 106 where a second dielectric material is formed over the first dielectric material. The second dielectric material has a second thermal expansion coefficient. The method 10 further includes an operation 108 where the second dielectric material is recessed to form an isolation structure between the fin structures. In some embodiments, the isolation structure comprises the first dielectric material and the second dielectric material. In some the embodiments, the substrate thermal expansion coefficient is in between the first thermal expansion coefficient and the second thermal expansion coefficient.

The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method.

Figure 2:
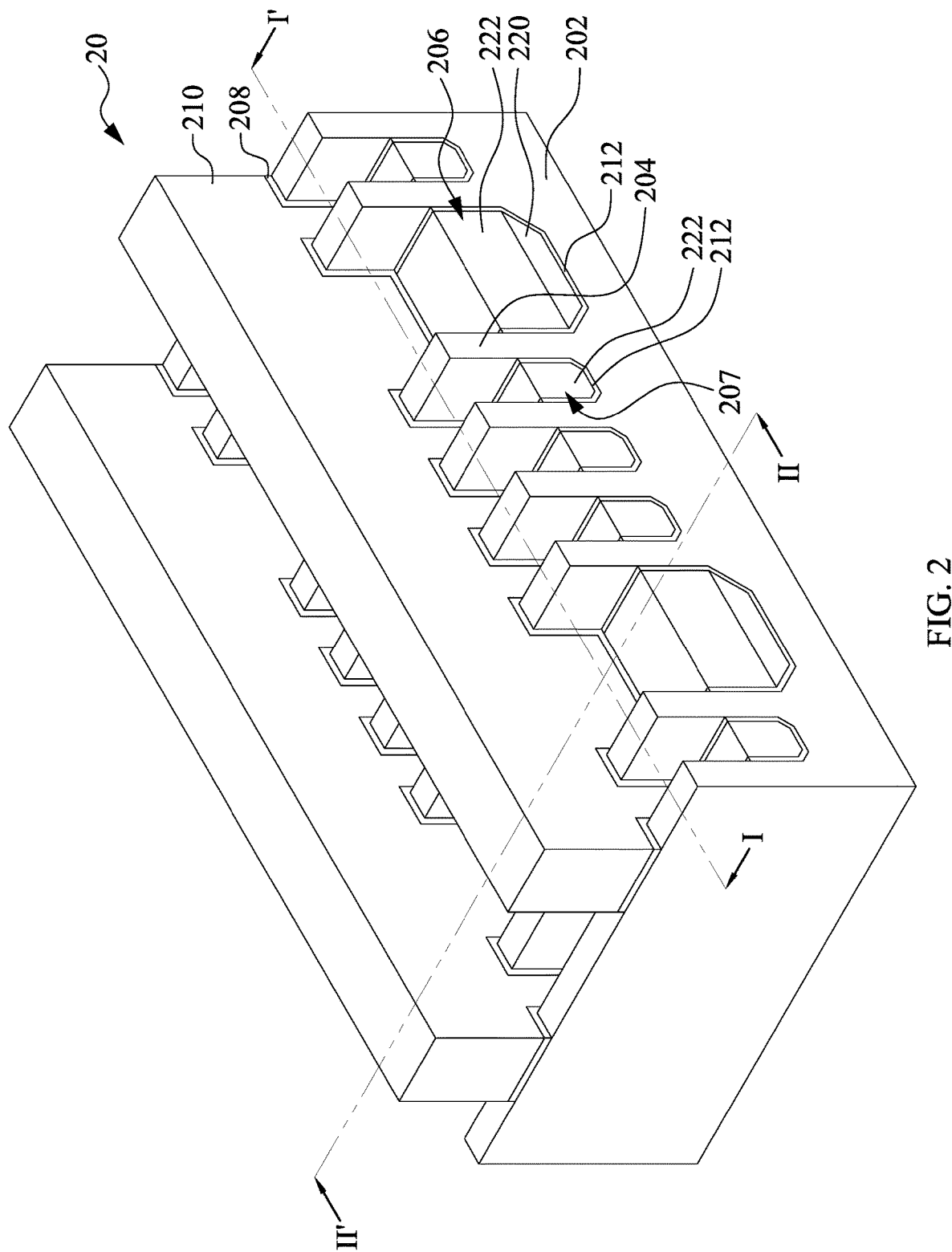
FIG. 2 is a schematic perspective drawing illustrating a semiconductor structure according to aspects of the present disclosure.

FIG. 2 is a schematic perspective drawing illustrating a semiconductor structure according to aspects of the present disclosure. The semiconductor structure 20 includes a substrate 202 having fin structures 204. The substrate 202 comprises a material having a substrate thermal expansion coefficient. The semiconductor structure 20 further includes isolation structures 206 and 207 disposed between the fin structures 204. In some embodiments, the fin structures 204 protrude from the isolation structures 206 and 207. The isolation structures 206 and 207 include a first isolation structure 206 and a second isolation structure 207. In some embodiments, the first isolation structure 206 has a greater depth and/or a greater width than the second isolation structure 207. In alternative embodiments, the first isolation structure 206 has the same depth and/or width as the second isolation structure 207. In some embodiments, the first isolation structure 206 comprises a first dielectric material 220 and a second dielectric material 222. The first dielectric material 220 has a first thermal expansion coefficient and the second dielectric material 222 has a second thermal expansion coefficient. In some embodiments, the substrate thermal expansion coefficient is in between the first thermal expansion coefficient and the second thermal expansion coefficient, and thereby thermal stress can be balanced during an operation of thermal treatment and the fin structures 204 do not or to a less extent suffer from the fin bending. In some embodiments, the first dielectric material 220 is disposed between the substrate 202 and the second dielectric material 222. In some embodiments, the semiconductor structure 20 includes a dielectric liner 212 sandwiched between the first isolation structure 206 and the substrate 202, and between the first isolation structure 206 and the fin structures 204, In some embodiments, the semiconductor structure 20 includes a dielectric liner 212 sandwiched between the second isolation structure 207 and the substrate 202, and between the second isolation structure 207 and the fin structure 204, A gate dielectric layer 208 may be disposed over a portion of the isolation structures 206 and 207, and along sidewalls and upper surfaces of the fin structures 204. In some embodiments, the gate dielectric layer 208 extends along a direction perpendicular to a longitudinal axis of the fin structures 204. Further, a gate electrode 210 may be disposed over the gate dielectric layer 208. FIG. 2 further illustrates reference cross-sections that are used in later figures. Cross-sections taken along a line I-I' are across the fin structures 204 in a direction perpendicular to a longitudinal axis of the fin structures 204 and not through the gate electrode 210. Cross-sections taken along a line are across the gate electrode 210 in a direction along a longitudinal axis of the fin structures 204 but not through the fin structures.

Figure 3A:
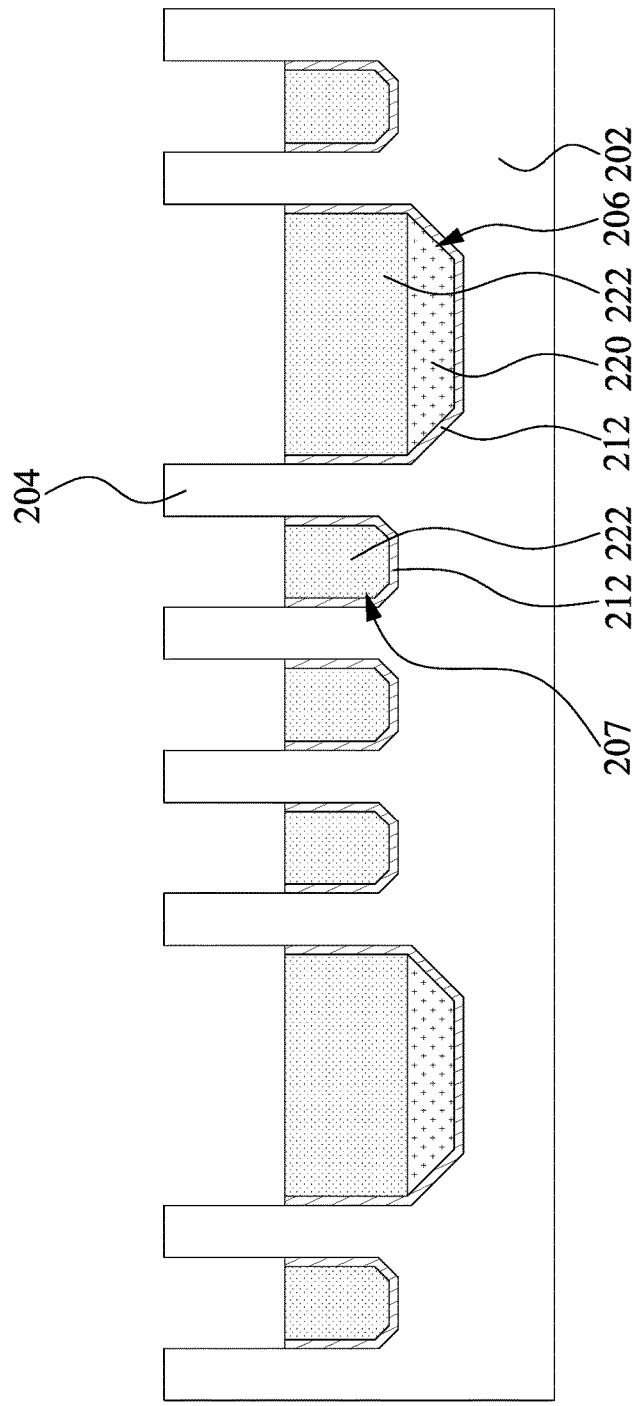
FIGS. 3A, 3B and 3C are cross-sectional views of some examples of a semiconductor structure taken along a line I-I' of FIG. 2 according to aspects of the present disclosure.
Figure 3B:
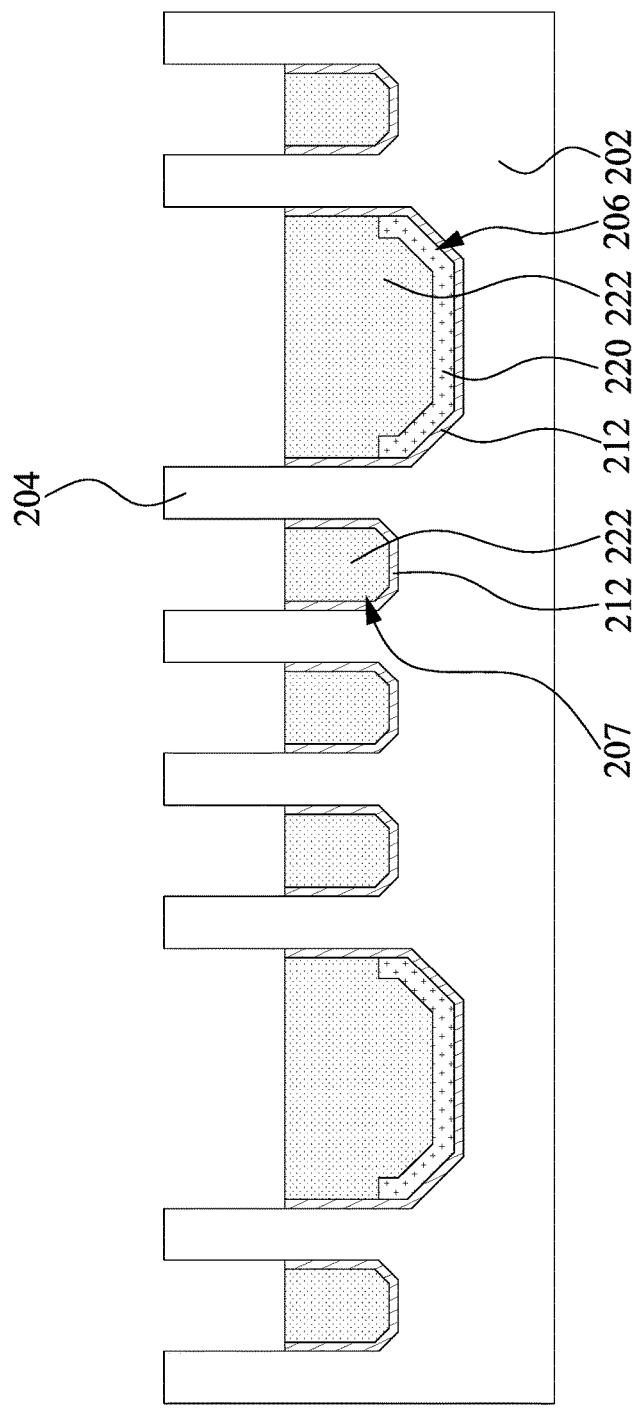
Figure 3C:
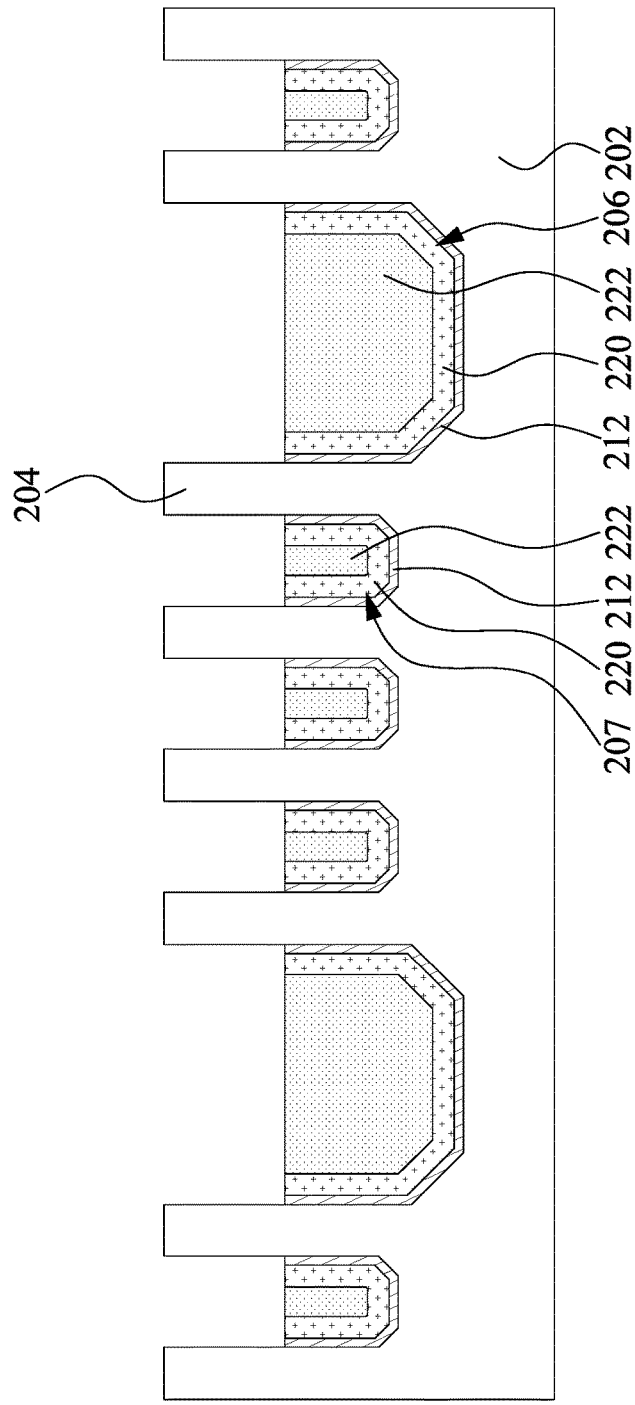

FIGS. 3A, 3B and 3C are cross-sectional views of some examples of a semiconductor structure taken along a line I-I' of FIG. 2 according to aspects of the present disclosure. FIG. 3A illustrates a cross-sectional view of the semiconductor structure in FIG. 2 taken along a line I-I'. FIGS. 3B and 3C illustrate the variations of FIG. 3A according to aspects of the present disclosure. In some embodiments as shown in FIG. 3A, the isolation structures include the first isolation structure 206 and the second isolation structure 207, and the first isolation structure 206 has a greater depth and/or a greater width than the second isolation structure 207. The first isolation structure 206 comprises the first dielectric material 220 and the second dielectric material 222, while the second isolation structure 207 comprises the second dielectric material 222 but not the first dielectric material 220. In some embodiments, the second isolation structure 207 consists essentially of the second dielectric material 222. In some alternative embodiments, the second isolation structure 207 comprises the first dielectric material 220 and the second dielectric material 222. With respect to the first isolation structure 206, the first dielectric material 220 is sandwiched between the substrate 202 and the second dielectric material 222. The first dielectric material 220 has a substantially planar upper surface. In some embodiments, "substantially planar" may, but is not limited to, be defined as having a variation between an uppermost point of a surface and a lowermost point of a surface that is less than about ten angstroms. An interface between the first dielectric material 220 and the second dielectric material 222 is substantially planar. In some embodiments, the upper surface of the first dielectric material 220 is below or at the same horizontal level as a bottom of the second isolation structure 207.

In some alternative embodiments as shown in FIG. 3B, the first dielectric material 220 is disposed conformally along a bottom of the first isolation structure 206. The first dielectric material 220 has a concave upper surface. An interface between the first dielectric material 220 and the second dielectric material 222 is concave. A bottom and at least a portion of edges of the second dielectric material 222 are surrounded by the first dielectric material 220. The first dielectric material 220 and the second dielectric material 222 constitute sidewalls of the first isolation structure 206.

In some embodiments, an uppermost surface of the first dielectric material 220 is below or at the same horizontal level as a bottom of the second isolation structure 207. In still some alternative embodiments as shown in FIG. 3C, both the first isolation structure 206 and the second isolation structure 207 comprise the first dielectric material 220 and the second dielectric material 222. The first dielectric material 220 constitutes a bottom and edges of the first isolation structure 206 and the second isolation structure 207. A bottom and edges of the second dielectric material 222 are surrounded by the first dielectric material 220. The first dielectric material 220 has an upper surface coplanar with an upper surface of the second dielectric material 222.

Figure 4:
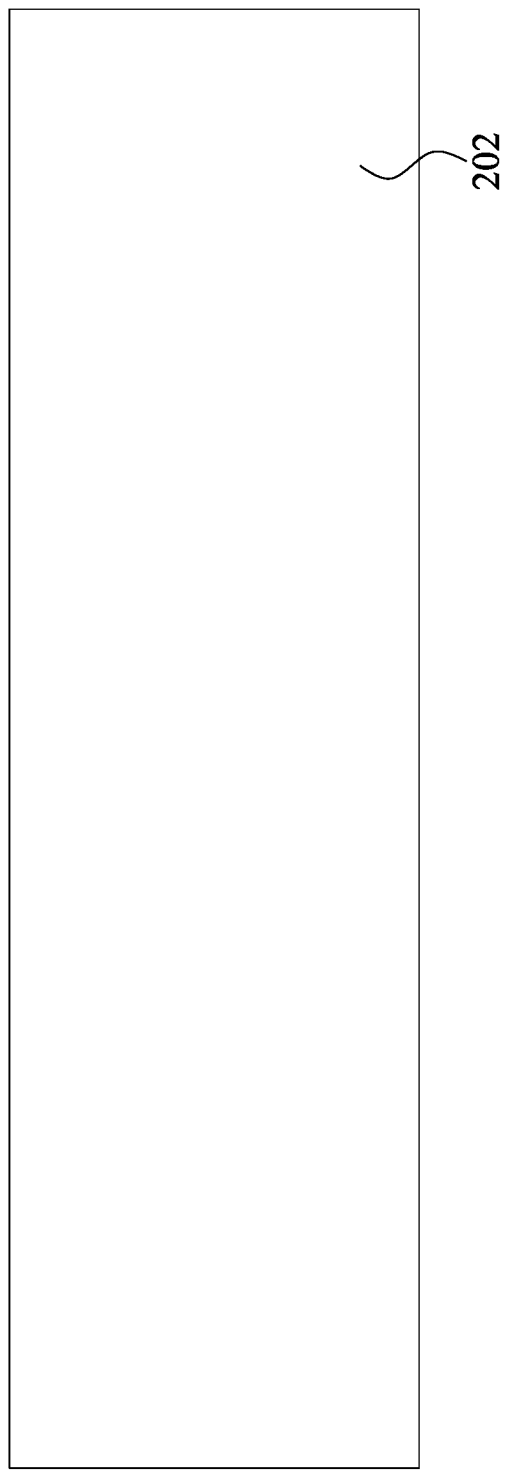
FIGS. 4 to 12 are cross-sectional views of a semiconductor structure taken along a line I-I' of FIG. 2 at various fabrication stages according to aspects of the present disclosure.
Figure 5:
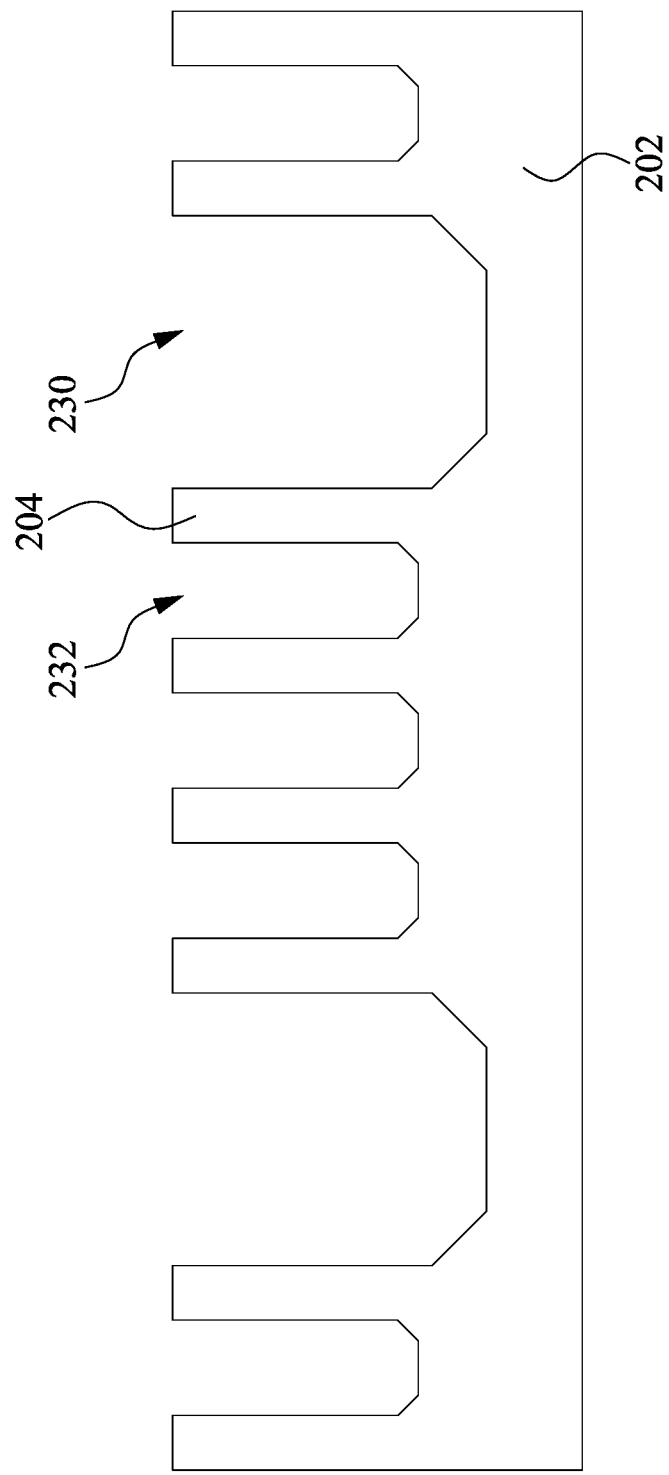

FIGS. 4 to 12 are cross-sectional views of a semiconductor structure taken along line of FIG. 2 at various fabrication stages according to aspects of the present disclosure. FIGS. 4 and 5 illustrate a substrate 202 provided with fin structures 204 according to operation 102. As shown in FIG. 4, a substrate 202 is provided. The substrate 202 may be a semiconductor substrate, such as a bulk semiconductor, a semiconductor-on-insulator (SOI) substrate, or the like, which may be doped (e.g., with a p-type or an n-type dopant) or undoped. The substrate 202 may be a semiconductor wafer such as a silicon wafer. Alternatively or additionally, the substrate 202 may include elementary semiconductor materials, compound semiconductor materials, or alloy semiconductor materials. Examples of elementary semiconductor materials may be, for example but not limited thereto, single crystal silicon, polysilicon, amorphous silicon, germanium (Ge), and/or diamond. Examples of compound semiconductor materials may be, for example but not limited thereto, silicon carbide (SiC), gallium arsenide (GaAs), gallium phosphide (GaP), indium phosphide (InP), indium arsenide (InAs), and/or indium antimonide (InSb). Examples of alloy semiconductor materials may be, for example but not limited thereto, SiGe, GaAsP, AlInAs, AlGaAs, GaInAs, GaInP, and/or GaInAsP. The substrate 202 may include various doping configurations depending on design requirements as is known in the art. For example, different doping profiles n wells and p wells) may be formed on the substrate 202 in regions designed for different device types (e.g., n-type field effect transistors (NFET), p-type field effect transistors (PITT)). The suitable doping may include ion implantation of dopants and/or diffusion processes.

Referring to FIG. 5, fin structures 204 are formed in the substrate 202. In some embodiments, the fin structures 204 are formed in the substrate 202 by etching and photolithography techniques. For examples, trenches including first trenches 230 and second trenches 232 can be formed in the substrate 202. In some embodiments, the trenches with various widths and/or depths are etched in the substrate 202 to form the fin structures 204. In some embodiments, the first trenches 230 have a greater depth and/or a greater width than the second trenches 232. In some embodiments, the fin structures 204 have a width of approximately between 1 nm and 10 nm, a spacing of approximately between 5 nm and 50 nm, and a height of approximately between 30 nm and 80 nm, but the disclosure is not limited thereto. Other suitable layouts of the fin structures 204 are within the contemplated scope of the disclosure. The etching may include anisotropic etching, isotropic etching, a combination thereof, or any suitable etching process. By way of example, the etching may include a reactive ion etch (RIE), neutral beam etch (NBE), or any other suitable process, or a combination thereof.

Figure 6:
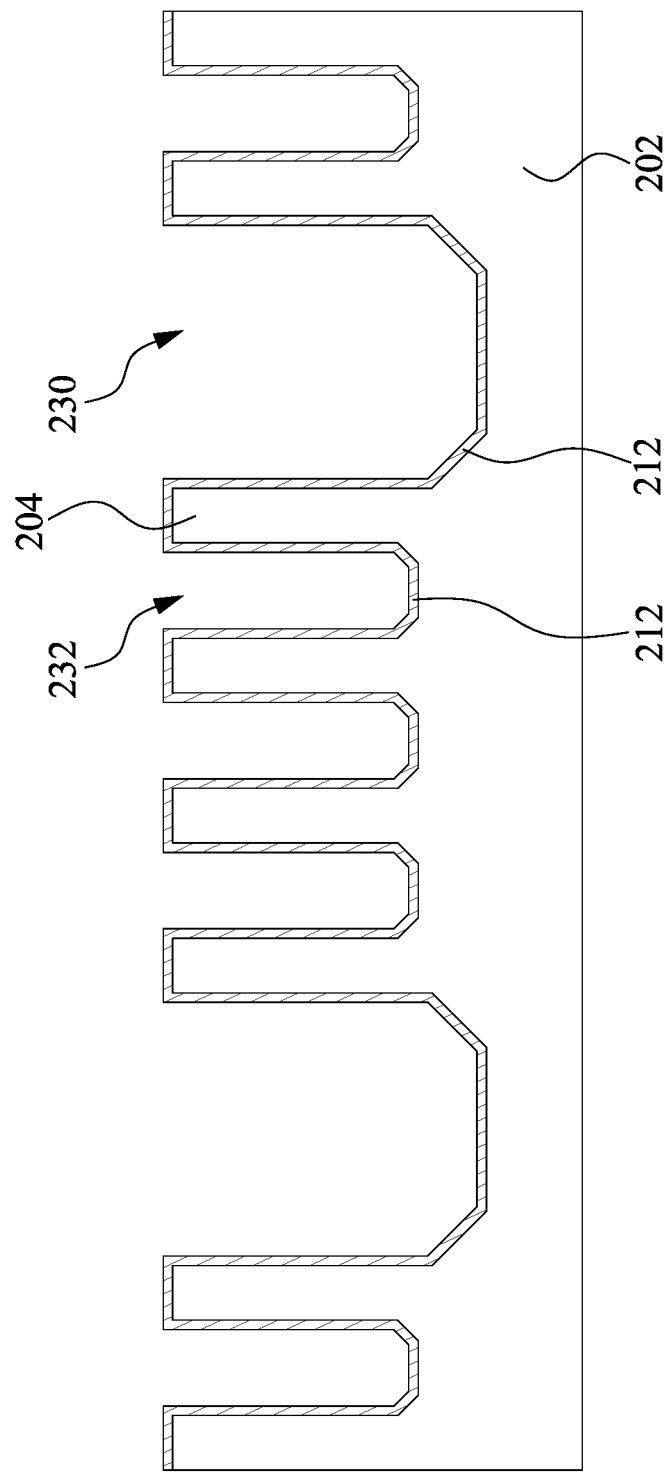

Referring to FIG. 6, a dielectric liner 212 is formed conformally to cover the substrate 202 and the fin structures 204. In some embodiments, the dielectric liner 212 covers upper surfaces of the substrate 202, and sidewalls and upper surfaces of the fin structures 204. In some embodiments, the dielectric liner 212 may be omitted. In some embodiments, the dielectric liner 212 has a thickness from a few angstroms (Å) to a few nanometers (am), for example, from 0.5 nm to 5 nm, but the disclosure is not limited thereto. In some embodiments, the dielectric liner 212 comprises silicon oxide, but the disclosure is not limited thereto. In some embodiments, the dielectric liner 212 may comprise a high-k dielectric material. For example, the high-k dielectric material may be hafnium oxide, aluminum oxide, titanium oxide, hafnium zirconium oxide, tantalum oxide, hafnium silicon oxide, zirconium oxide, zirconium silicon oxide, lanthanide oxide, or any other suitable material, or a combination thereof. Other suitable materials are within the contemplated scope of the disclosure. The dielectric liner 212 may be formed by any suitable process including a thermal oxidation process, a rapid-thermal oxidation process, chemical vapor deposition (CVD), physical vapor deposition (PVD), atomic layer deposition (ALD), and/or other suitable methods.

Figure 7:
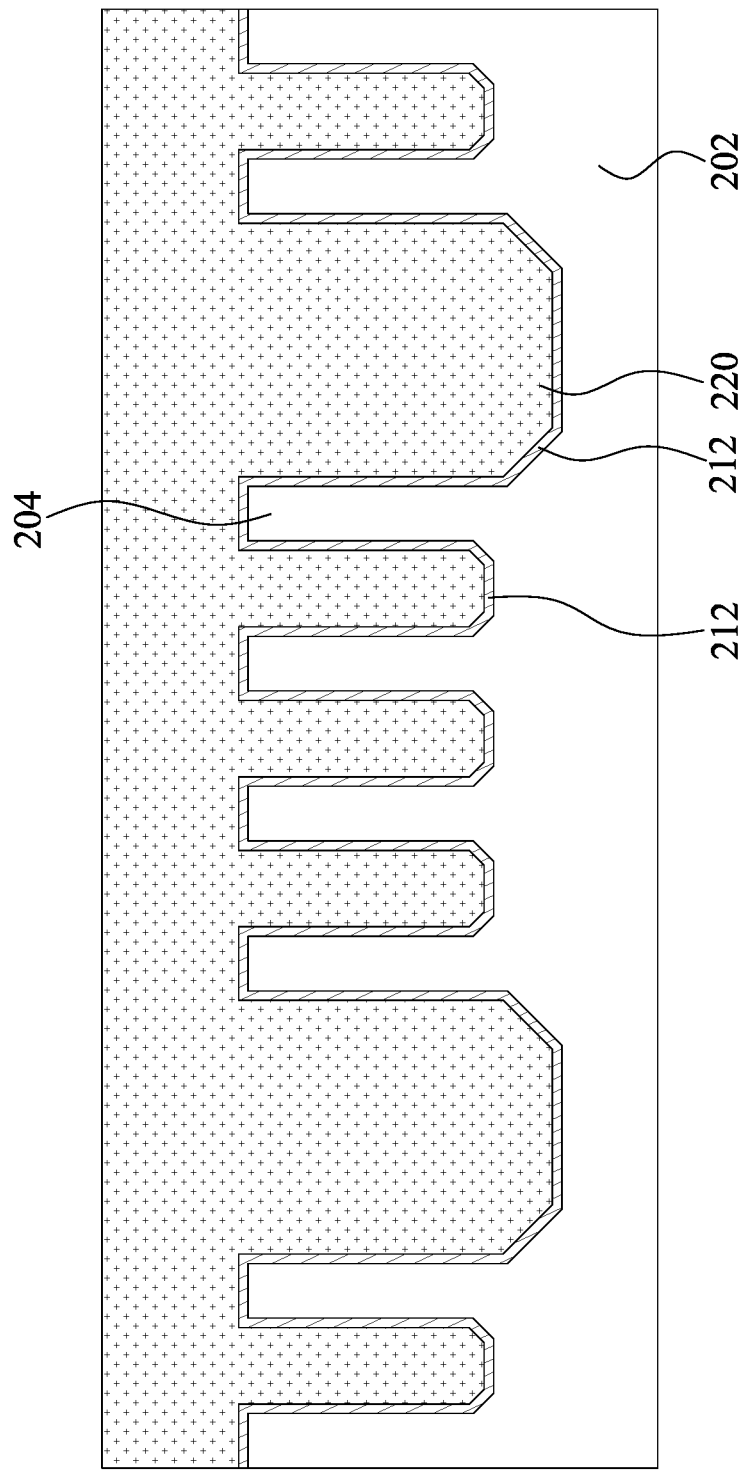

Referring to FIG. 7, a first dielectric material 220 is formed over the substrate 202 and the fin structures 204 according to operation 104. The first dielectric material 220 has a first thermal expansion coefficient. In some embodiments, the first dielectric material 220 fills the first trenches 230 and the second trenches 232. In some embodiments, the first thermal expansion coefficient of the first dielectric material 220 is greater than the substrate thermal expansion coefficient. In some embodiments, the first dielectric material 220 comprises silicon nitride, hafnium oxide, aluminum oxide, or any other suitable material, or a combination thereof. The first dielectric material 220 may be formed by CVD, such as HDP-CVD and flowable CVD (FCVD) (e.g., a CVD based material deposition in a remote plasma system and post curing to make it convert to another material, such as an oxide), PVD, or any other suitable process, or a combination thereof.

Figure 8:
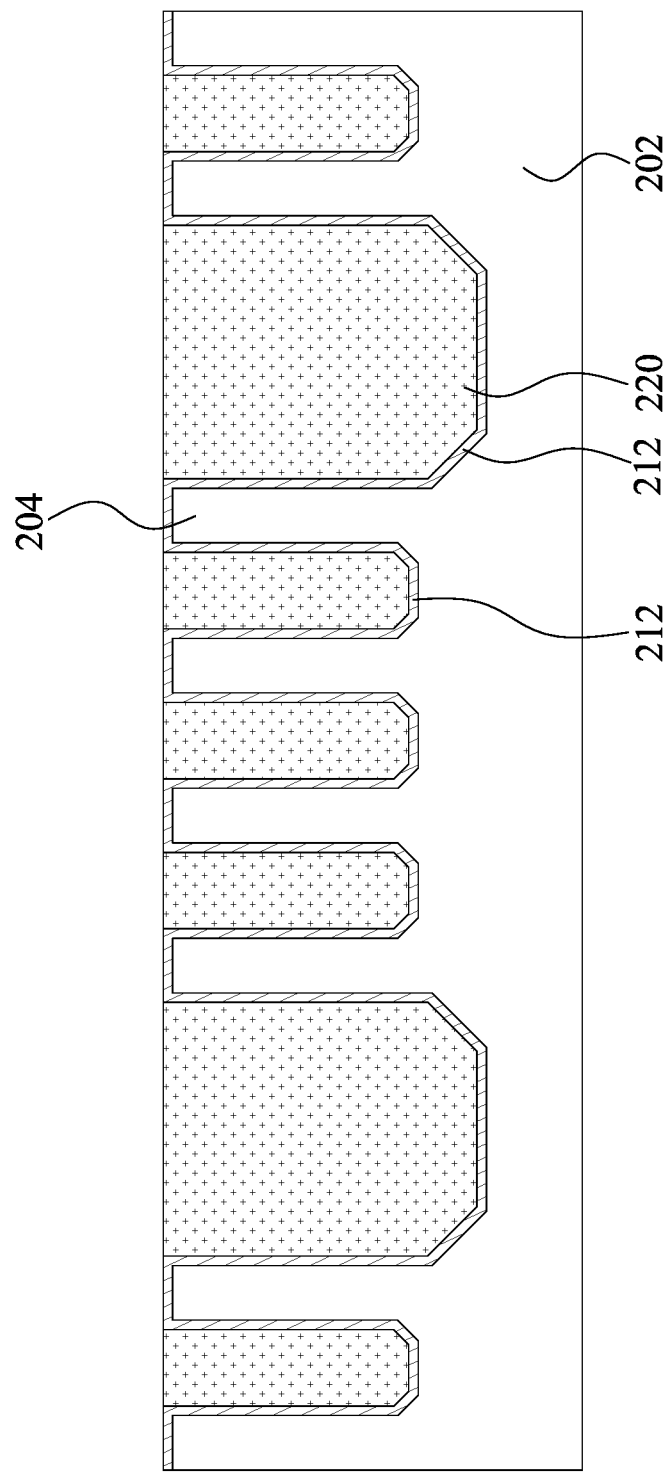

Referring to FIG. 8, a portion of the first dielectric material 220 is removed by, for example, a planarization process, such that the first dielectric material 220 has an upper surface coplanar with the dielectric liner 212 (if any) disposed over the upper surfaces of the fin structures 204, or with the upper surfaces of the fin structures 204 (if the dielectric liner 212 is omitted). In some embodiments, the planarization process includes a chemical mechanical polishing (CMP) process, or any other suitable process, or a combination thereof.

Figure 9:
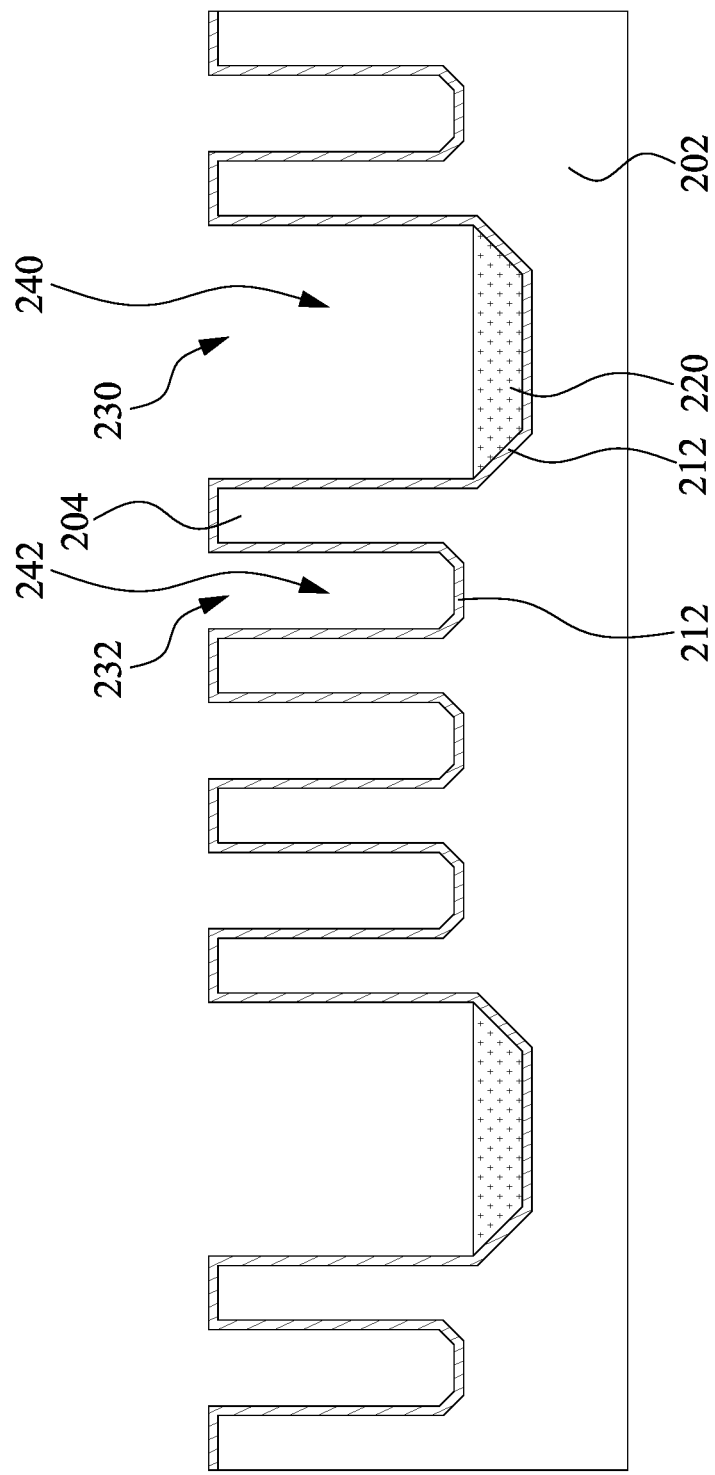

Referring to FIG. 9, a portion of the first dielectric material 220 is removed to form recesses including first recesses 240 and second recesses 242. In some embodiments, bottoms of the first recesses 240 have an interface with the first dielectric material 220; that is, lower portions of the trenches 230 are disposed with the first dielectric material 220, while upper portions of the trenches 230 form the recesses 240. In some embodiments, bottoms of the recesses 242 have an interface with the dielectric material 212 (if any), or with the substrate 202 (if the dielectric liner 212 is omitted); that is, the recesses 242 are equivalent to the trenches 232. In alternative embodiments, bottoms of the recesses 242 have an interface with the first dielectric material 220 (not shown); that is, lower portions of the trenches 232 are disposed with the first dielectric material 220, while upper portions of the trenches 232 form the recesses 242. In some embodiments, the first dielectric material 220 has a substantially planar upper surface as illustrated. The recesses 240 and 242 may be formed by any suitable etching process, such as one that is selective to the first dielectric material 220 rather than the substrate 202. The etching process may include anisotropic etching, isotropic etching, or any other suitable etching process, or a combination thereof.

Figure 10:
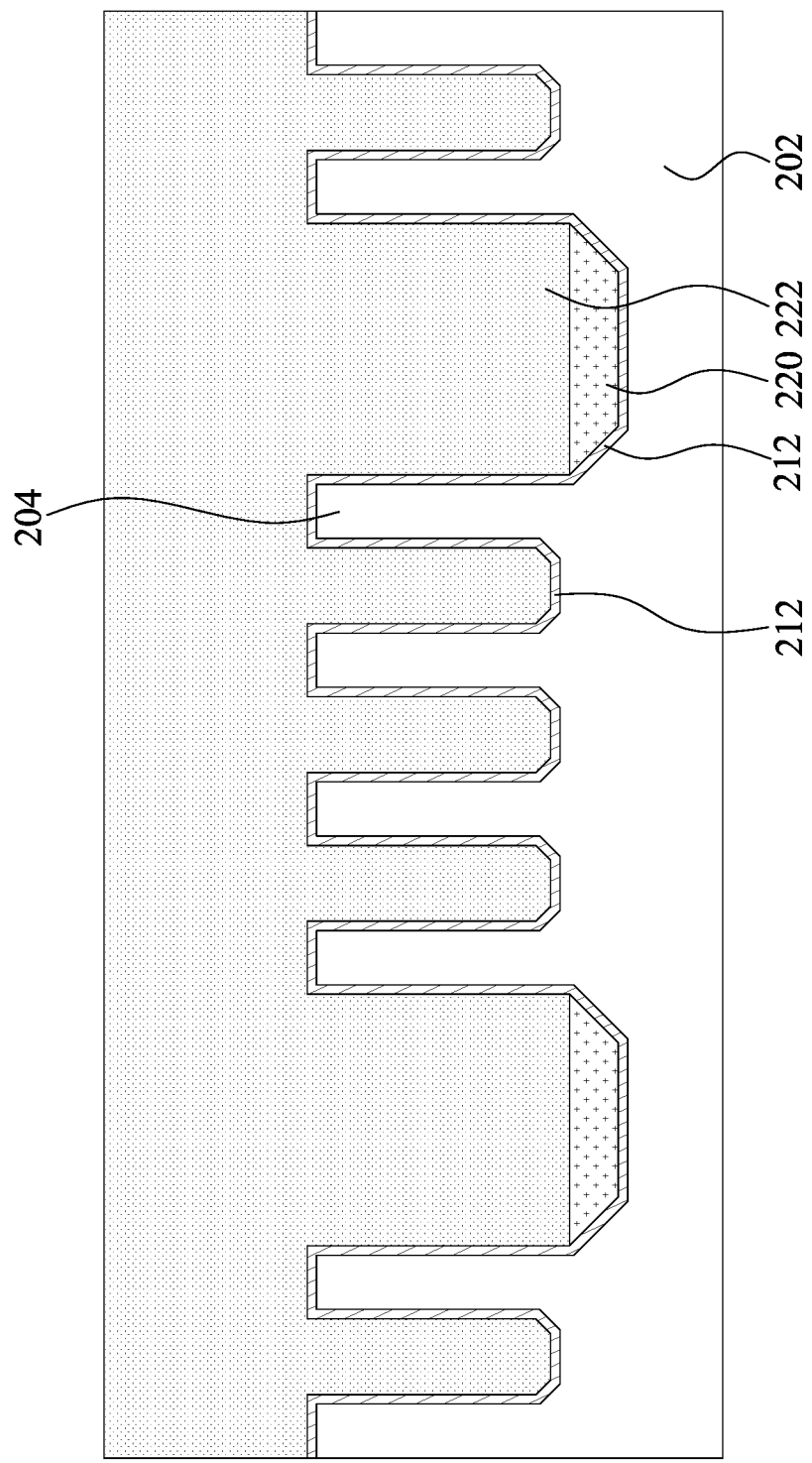

Referring to FIG. 10, a second dielectric material 222 is formed over the first dielectric material 220 according to operation 106. The second dielectric material 222 has a second thermal expansion coefficient. In some embodiments, the second dielectric material 222 is formed in the recesses 240 and 242. In some embodiments, the second dielectric material 222 is also formed over the fin structures 204. In some embodiments where the first thermal expansion coefficient of the first dielectric material 220 is greater than the substrate thermal expansion coefficient, the second thermal expansion coefficient of the second dielectric material 222 is smaller than the substrate thermal expansion coefficient. In alternative embodiments, the first thermal expansion coefficient is smaller than the substrate thermal expansion coefficient and the second thermal expansion coefficient is greater than the substrate thermal expansion coefficient. In some embodiments, the second dielectric material 222 may comprise silicon oxide, silicon nitride, silicon oxynitride, fluoride doped silicate glass (FSG), low-k dielectric, or any other suitable material, or a combination thereof. The second dielectric material 222 may be formed by CVD, such as HDP-CVD and flowable CVD (FCVD) (e.g., a CVD based material deposition in a remote plasma system and post curing to make it convert to another material, such as an oxide), PVD, or any other suitable process, or a combination thereof.

In some embodiments, after the second dielectric material 222 is formed over the first dielectric material 220 according to operation 106 as illustrate in FIG. 10, an annealing operation is implemented. It should be noted that, due to the substrate thermal expansion coefficient in between the first thermal expansion coefficient and the second thermal expansion coefficient according to some embodiments of the present disclosure, thermal stress is balanced during the annealing operation and thereby the fin bending can be avoided or at least mitigated.

Figure 11:
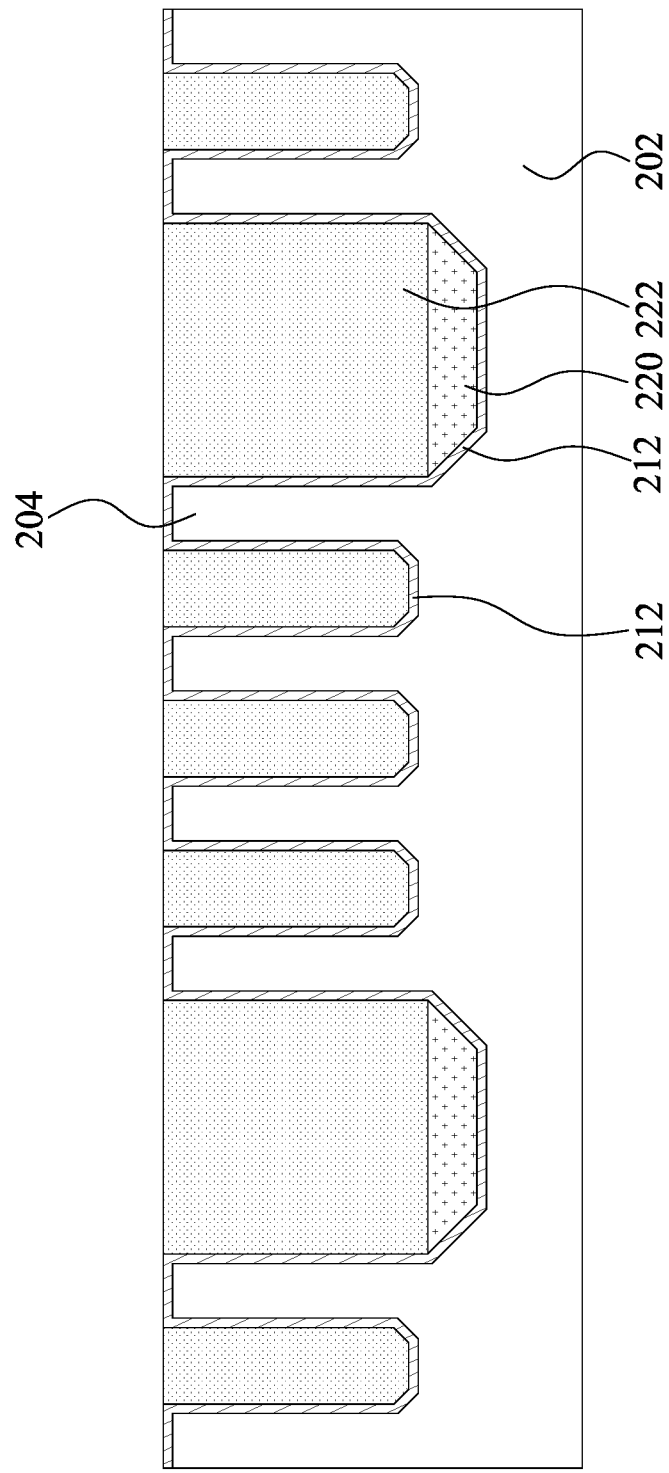

Referring to FIG. 11, a portion of the second dielectric material 222 is removed by, for example, a planarization process, such that the second dielectric material 222 has an upper surface coplanar with the dielectric liner 212 (if any) disposed over the upper surfaces of the fin structures 204, or with the upper surfaces of the fin structures 204 (if the dielectric liner 212 is omitted). In some embodiments, the planarization process includes a chemical mechanical polishing (CMP) process, or any other suitable process, or a combination thereof.

Figure 12:
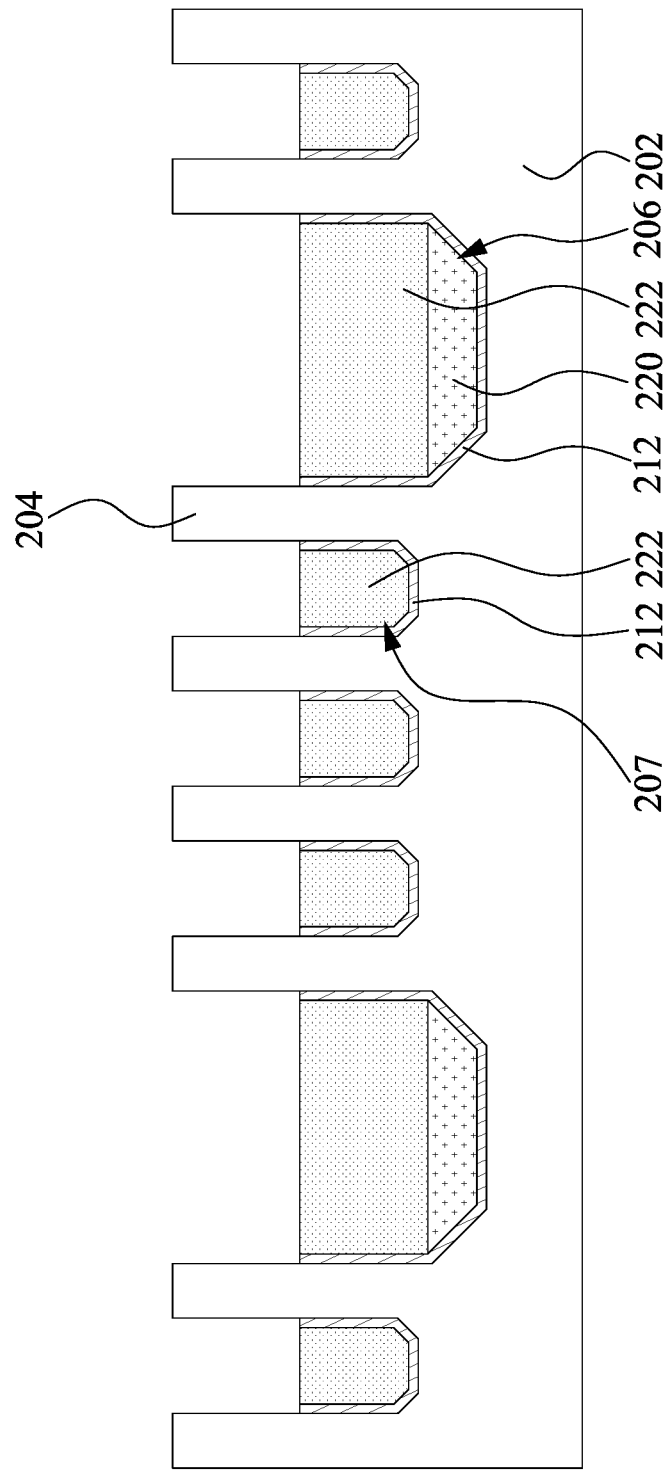

Referring to FIG. 12, the second dielectric material 222 is recessed to form isolation structures including first isolation structures 206 and second isolation structures 207 between the fin structures 204 according to operation 108. In some embodiments, a portion of the dielectric liner 212 is removed to expose a portion of sidewalls and upper surfaces of the fin structures 204. In some embodiments, the first isolation structures 206 comprise the first dielectric material 220 and the second dielectric material 222, In some embodiments, the second isolation structures 207 comprise the second dielectric material 222, but not the first dielectric material 220. In some embodiments, the second isolation structure 207 consists essentially of the second dielectric material 222. In alternative embodiments, the second isolation structures 207 comprise both the first dielectric material 220 and the second dielectric material 222. In some embodiments, a ratio between a thickness of the first dielectric material 220 and a thickness of the second dielectric material 222 depends on, for example, the materials and dimensions of the isolation structures 206 and 207, the fin structures 204 and the substrate 202, and may be in a range of approximately between 0.1 and 10, but the disclosure is not limited thereto. In some embodiments, the first isolation structures 206 and/or the second isolation structures 207 have a thickness in a range of approximately between 1 nm to 50 nm, but the disclosure is not limited thereto. The second dielectric material 222 may be recessed by any suitable etching process, such as one that is selective to the second dielectric material 222 rather than the substrate 202. The etching process may include anisotropic etching, isotropic etching, or any other suitable etching process, or a combination thereof.

The present disclosure is not limited to the above-mentioned embodiments, and may include other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 13:
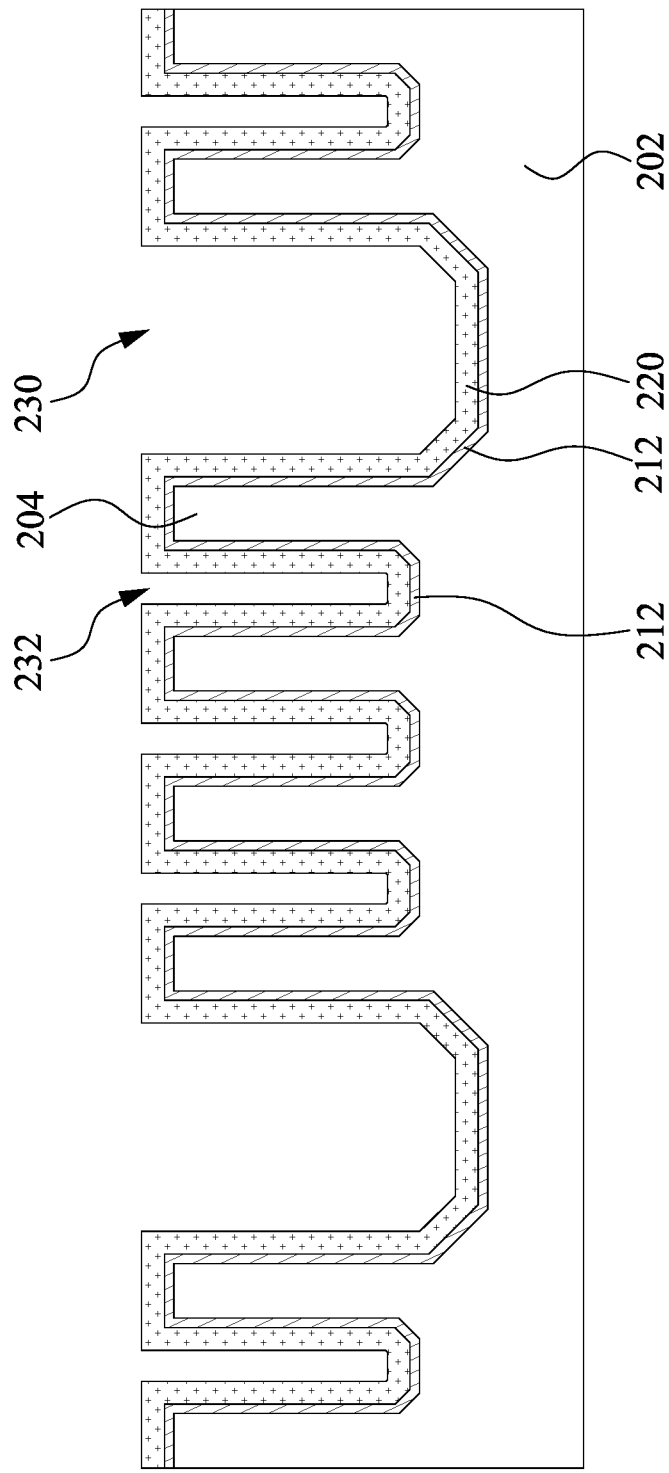
FIGS. 13 to 18 are cross-sectional views of a semiconductor structure taken along a line I-I' of FIG. 2 at various fabrication stages according to aspects of the disclosure in some embodiments alternative to FIGS. 7 to 12.

FIGS. 13 to 18 are cross-sectional views of a semiconductor structure taken along a line I-I' of FIG. 2 at various fabrication stages according to aspects of the disclosure in some embodiments alternative to FIGS. 7 to 12. Referring to FIG. 13, a first dielectric material 220 is formed over the substrate 202 and the fin structures 204 according to operation 104. In some embodiments, the first dielectric material 220 is formed conformally along upper surfaces of the substrate 202, and along sidewalk and upper surfaces of the fin structures 204 as illustrated. The first dielectric material 220 may be formed conformally by CVD, ALD, PVD, or any other suitable process, or a combination thereof.

Figure 14:
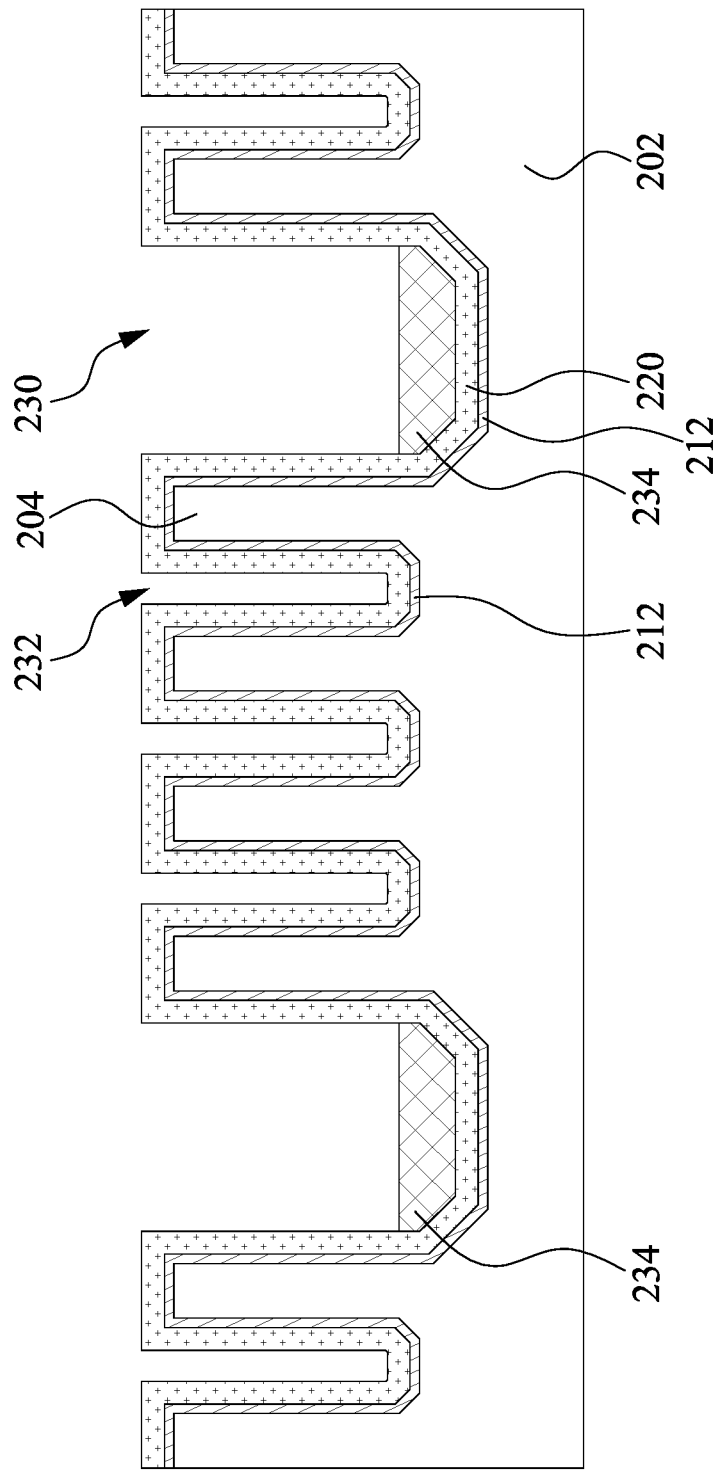

Referring to FIG. 14, a portion of the first dielectric material 220 is covered by a mask layer 234. In some embodiments, the mask layer 234 is disposed in the lower portion of the first trenches 230 to cover the portion of the first dielectric material 220 located at the lower portion of the first trenches 230. In some embodiments, the mask layer 234 includes a photoresist or a hard mask patterned by any suitable process such as photolithography, but the disclosure is not limited thereto.

Figure 15:
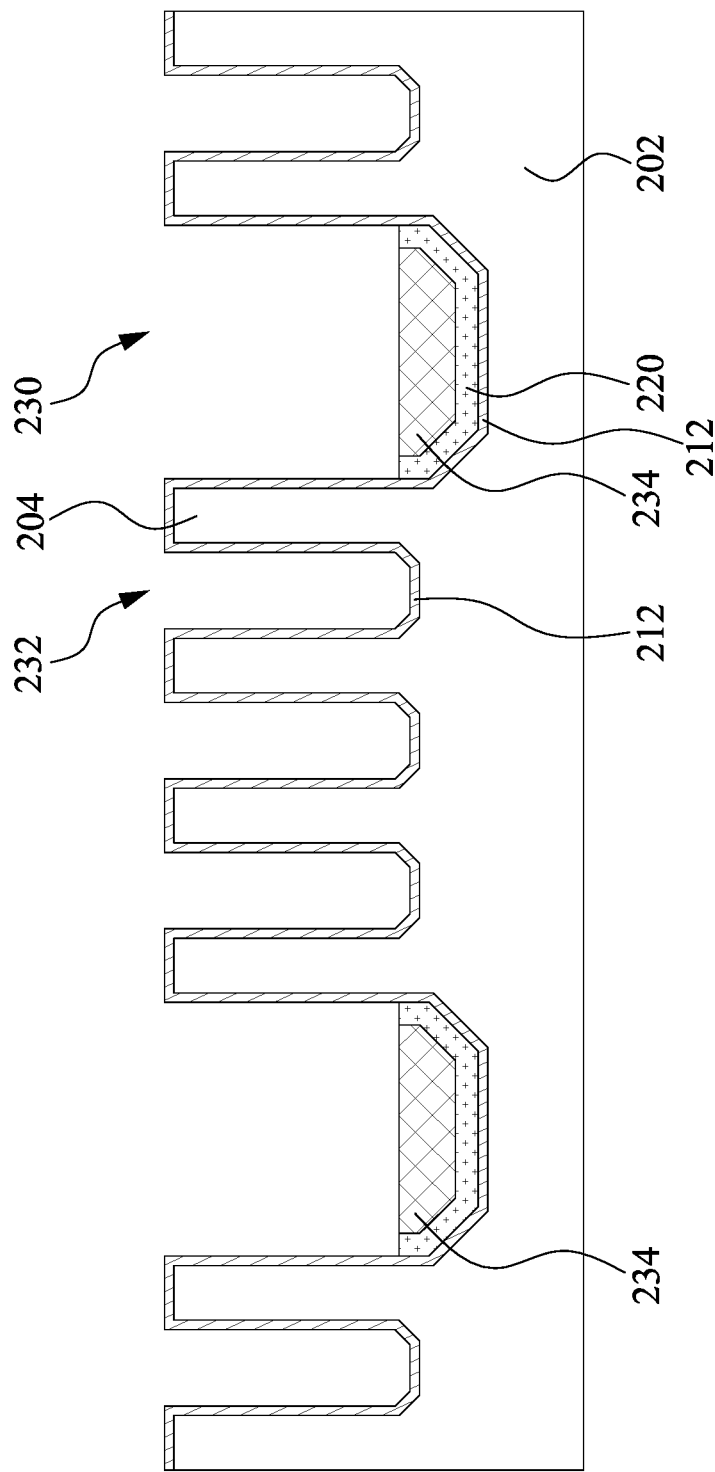

Referring to FIG. 15, a portion of the first dielectric material 220 exposed from the mask layer 230 is removed to expose a portion of the dielectric liner 212 (if any) or a portion of the fin structures 204 (if the dielectric liner 212 is omitted). In some embodiments, a portion of the first dielectric material 220 is remained in the first trenches 230. In some embodiments, the dielectric material 220 is removed from the second trenches 232. The portion of the first dielectric material 220 may be removed by any suitable etching process, such as one that is selective to the first dielectric material 220 rather than the substrate 202. The etching process may include anisotropic etching, isotropic etching, or any other suitable etching process, or a combination thereof.

Figure 16:
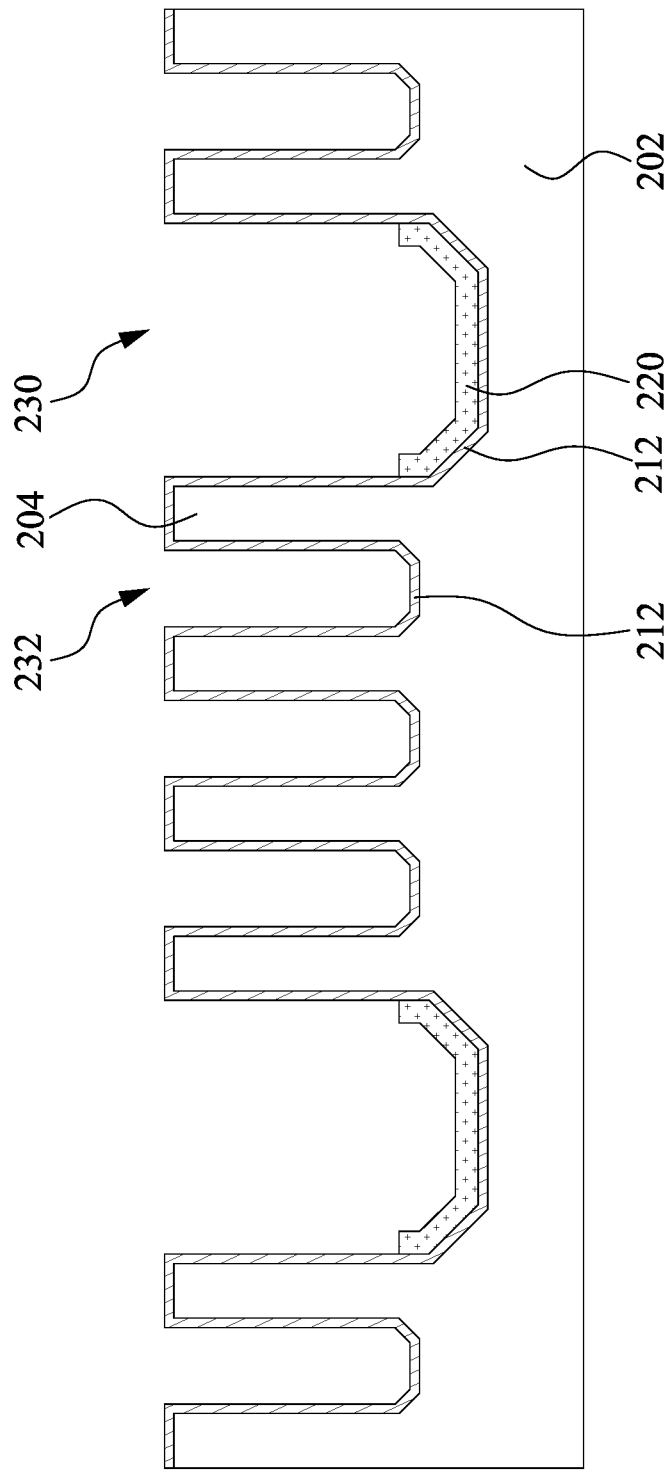

Referring to FIG. 16, the mask layer 234 is removed. In some embodiments, the first dielectric material 220 protected by the mask layer 234 is remained at the lower portion of the first trenches 230. The mask layer 234 may be removed by any suitable process, such as one that is selective to the mask layer 234 rather than the first dielectric material 220. For example, the mask layer 234 may be removed by an appropriate asking process, such as using oxygen plasma, stripping process, or by an appropriate etching process. Other appropriate processes for removing the mask layer 234 are within the contemplated scope of the disclosure.

Figure 17:
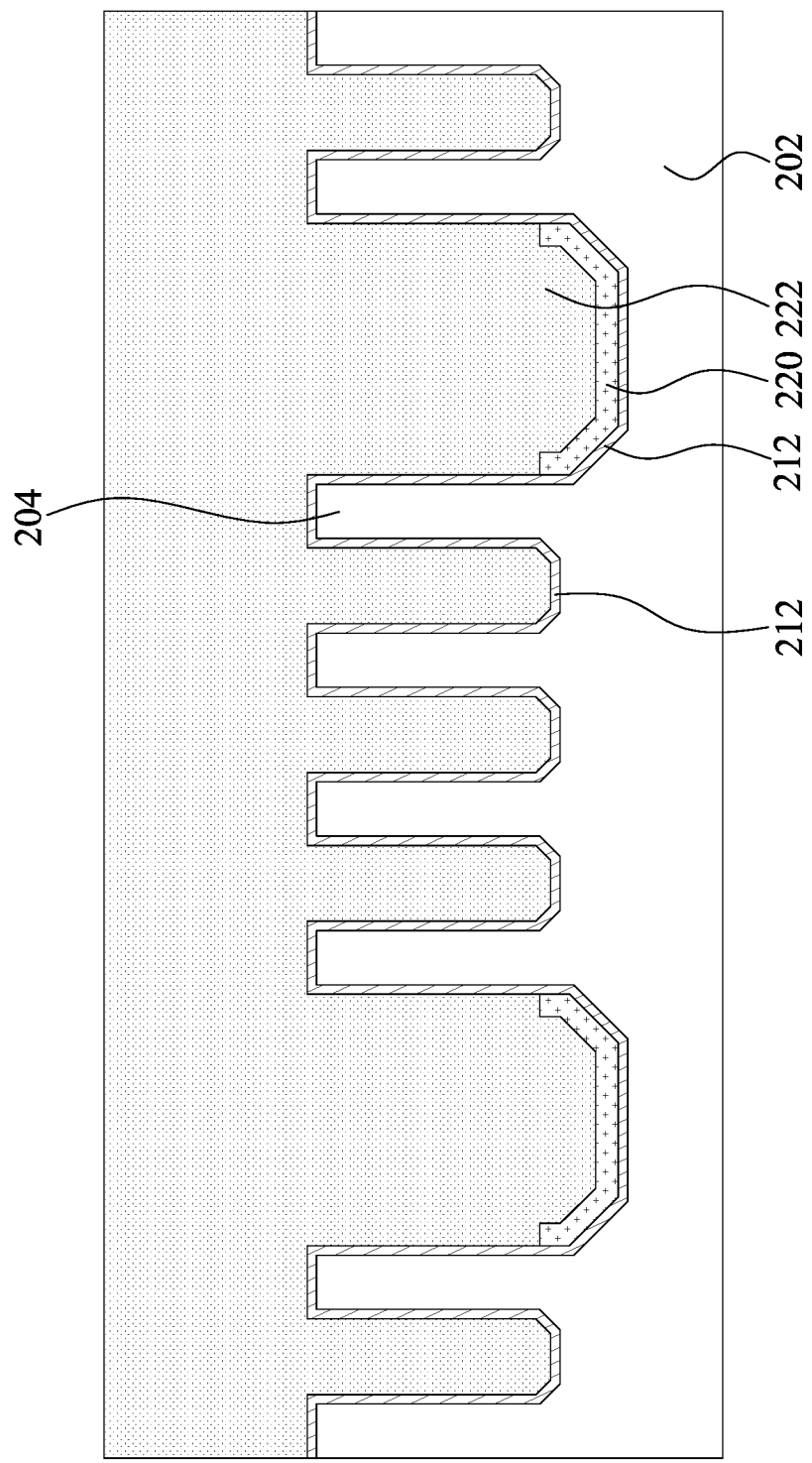

Referring to FIG. 17, a second dielectric material 222 is formed over the first dielectric material 220 according to operation 106. In some embodiments, the second dielectric material 222 is formed in the trenches 230 and 232. In some embodiments, the second dielectric material 222 is also formed over the fin structures 204. The second dielectric material 222 may be formed by CVD, such as HDP-CVD and flowable CVD (FCVD) (e.g., a CVD based material deposition in a remote plasma system and post curing to make it convert to another material, such as an oxide), PVD, or any other suitable process, or a combination thereof. In some embodiments, after the second dielectric material 222 is formed over the first dielectric material 220 according to operation 106 as illustrate in FIG. 17, an annealing operation is implemented. In some embodiments, following the annealing operation, a portion of the second dielectric material 222 is removed by a planarization process, such as a chemical mechanical polishing (CMP) process, or any other suitable process, or a combination thereof.

Figure 18:
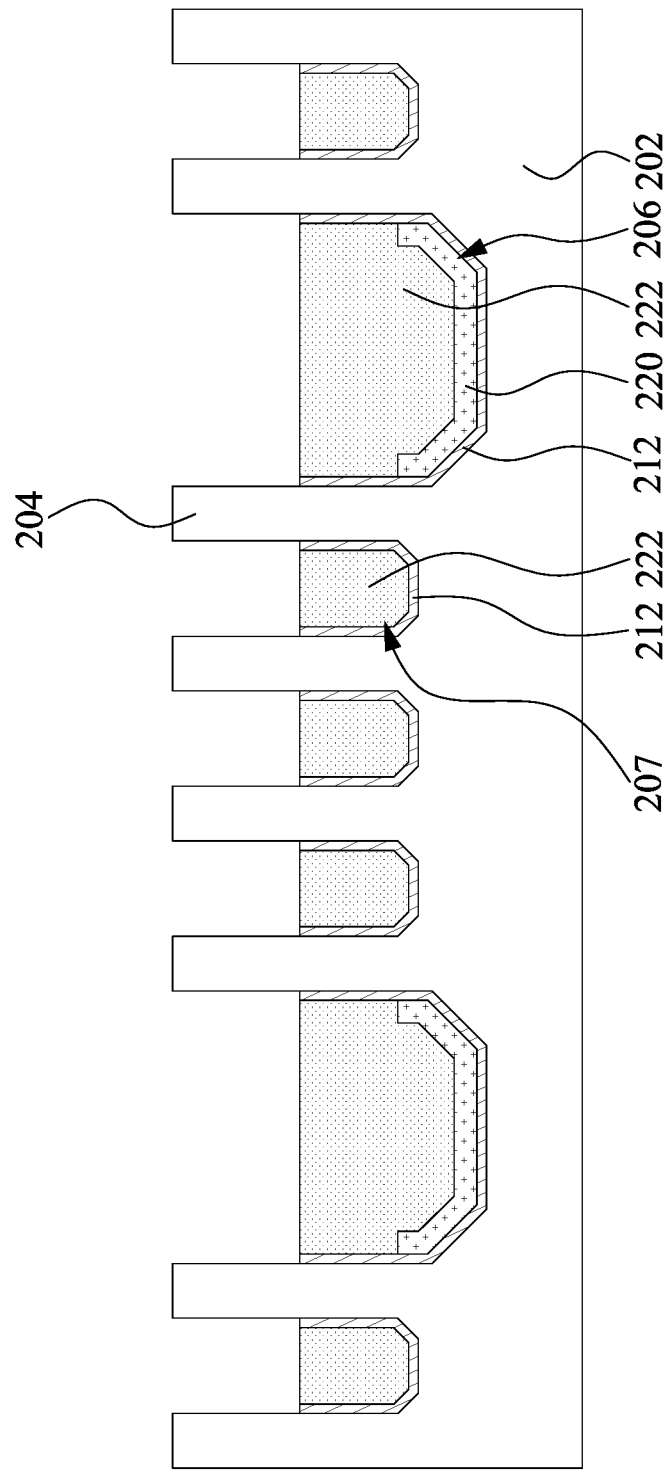

Referring to FIG. 18, the second dielectric material 222 is recessed to form isolation structures including first isolation structures 206 and second isolation structures 207 between the fin structures 204 according to operation 108. In some embodiments, a portion of the dielectric liner 212 is removed to expose a portion of sidewalls and upper surfaces of the fin structures 204. In some embodiments, a ratio between a thickness of the first dielectric material 220 and a thickness of the second dielectric material 222 depends on, for example, the materials and dimensions of the isolation structures 206 and 207, the fin structures 204 and the substrate 202, and may be in a range of between 0.1 and 10, but the disclosure is not limited thereto. In some embodiments, the first isolation structures 206 and/or the second isolation structures 207 have a thickness in a range of approximately between 1 nm to 50 nm, but the disclosure is not limited thereto. The second dielectric material 222 may be recessed by any suitable etching process, such as one that is selective to the second dielectric material 222.

Figure 19:
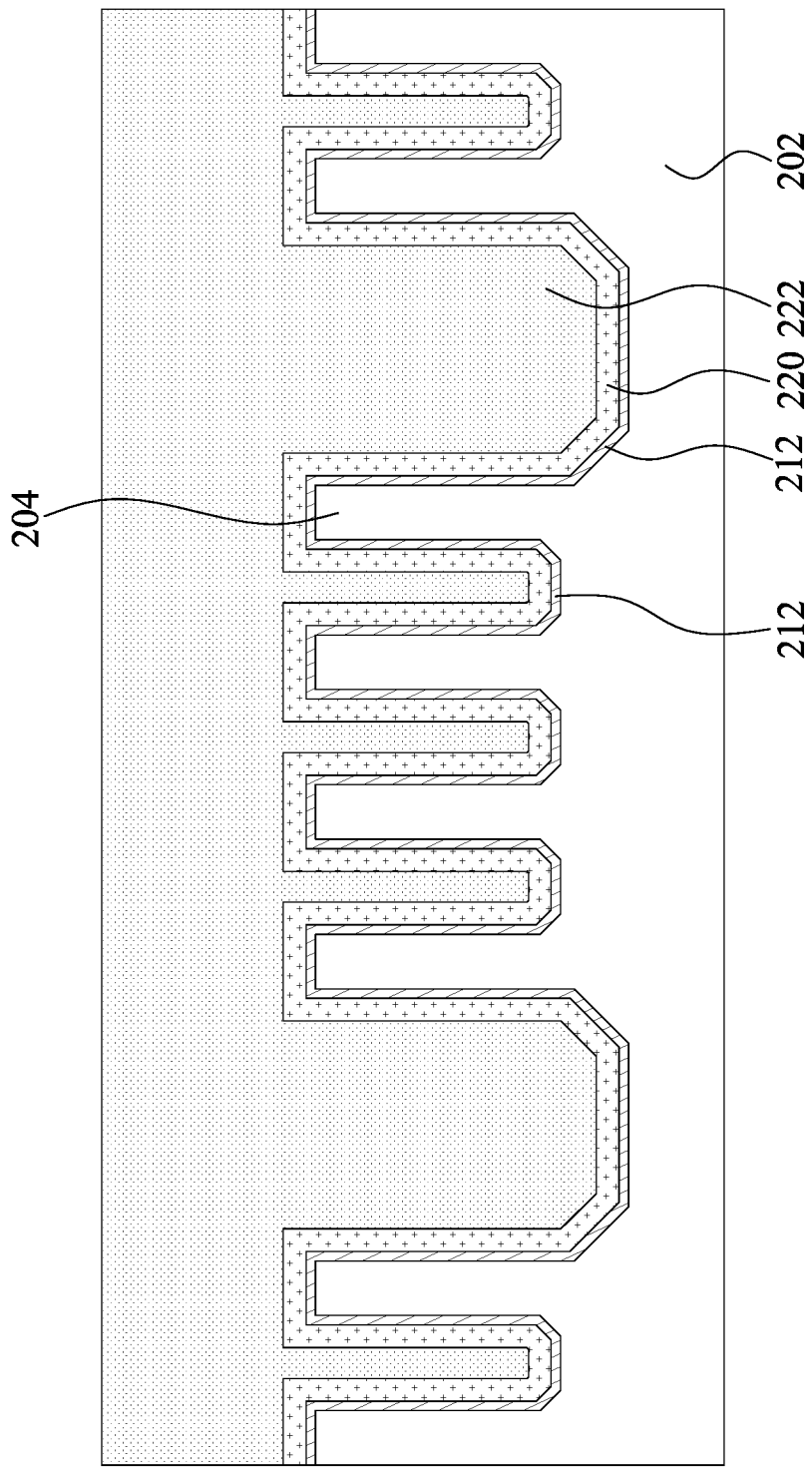
FIGS. 19 to 20 are cross-sectional views of a semiconductor structure taken along a line I-I' of FIG. 2 at various fabrication stages according to aspects of the disclosure in some embodiments alternative to FIGS. 14 to 18.
Figure 20:
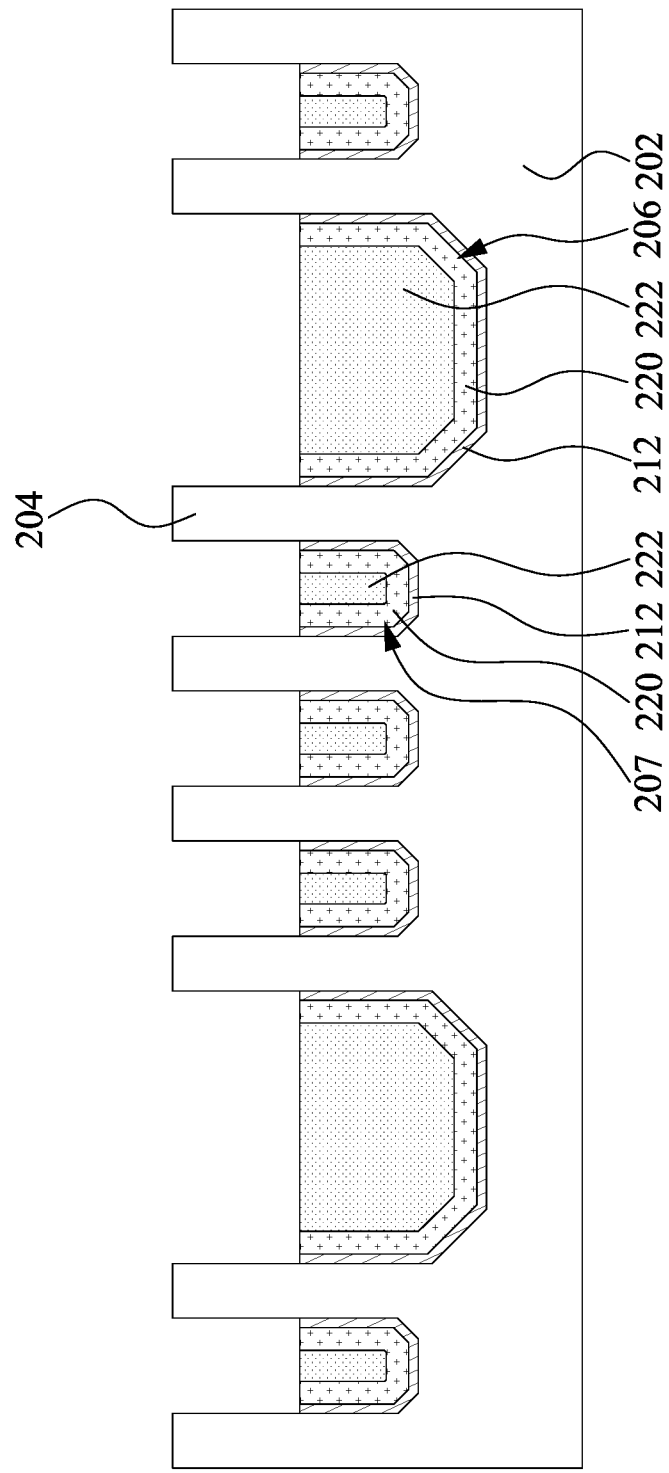

FIGS. 19 to 20 are cross-sectional views of a semiconductor structure taken along a line I-I' of FIG. 2 at various fabrication stages according to aspects of the disclosure in some embodiments. Referring to FIG. 19, a second dielectric material 222 is formed over the first dielectric material 220 according to operation 106, following the first dielectric material 220 formed conformally over the substrate 202 and the fin structures 204 according to operation 104 as illustrated in FIG. 13. In some embodiments, the second dielectric material 222 is formed in the trenches 230 and 232. In some embodiments, the second dielectric material 222 is also formed over the fin structures 204. The second dielectric material 222 may be formed by any suitable process as discussed above, but the disclosure is not limited thereto. In some embodiments, after the second dielectric material 222 is formed over the first dielectric material 220 according to operation 106 as illustrate in FIG. 19, an annealing operation is implemented.

Referring to FIG. 20, the second dielectric material 222 is recessed to form isolation structures including first isolation structures 206 and second isolation structures 207 between the fin structures 204 according to operation 108. In some embodiments, the second dielectric material 222 is recessed along with the first dielectric material 220. In some embodiments, a portion of the dielectric liner 212 is removed to expose a portion of sidewalls and upper surfaces of the fin structures 204. In some embodiments, the first isolation structures 206 comprise the first dielectric material 220 and the second dielectric material 222. In some embodiments, the second isolation structures 207 comprise the first dielectric material 220 and the second dielectric material 222. In some embodiments, the first isolation structures 206 and/or the second isolation structures 207 have a thickness in a range of approximately between 1 nm to 50 nm, but the disclosure is not limited thereto. The second dielectric material 222 may be recessed along with the first dielectric material 220 by any suitable etching process, such as a wet etching process, a dry etching process such as reactive ion etching (RIE), or a combination thereof, but the disclosure is not limited thereto.

Figure 21:
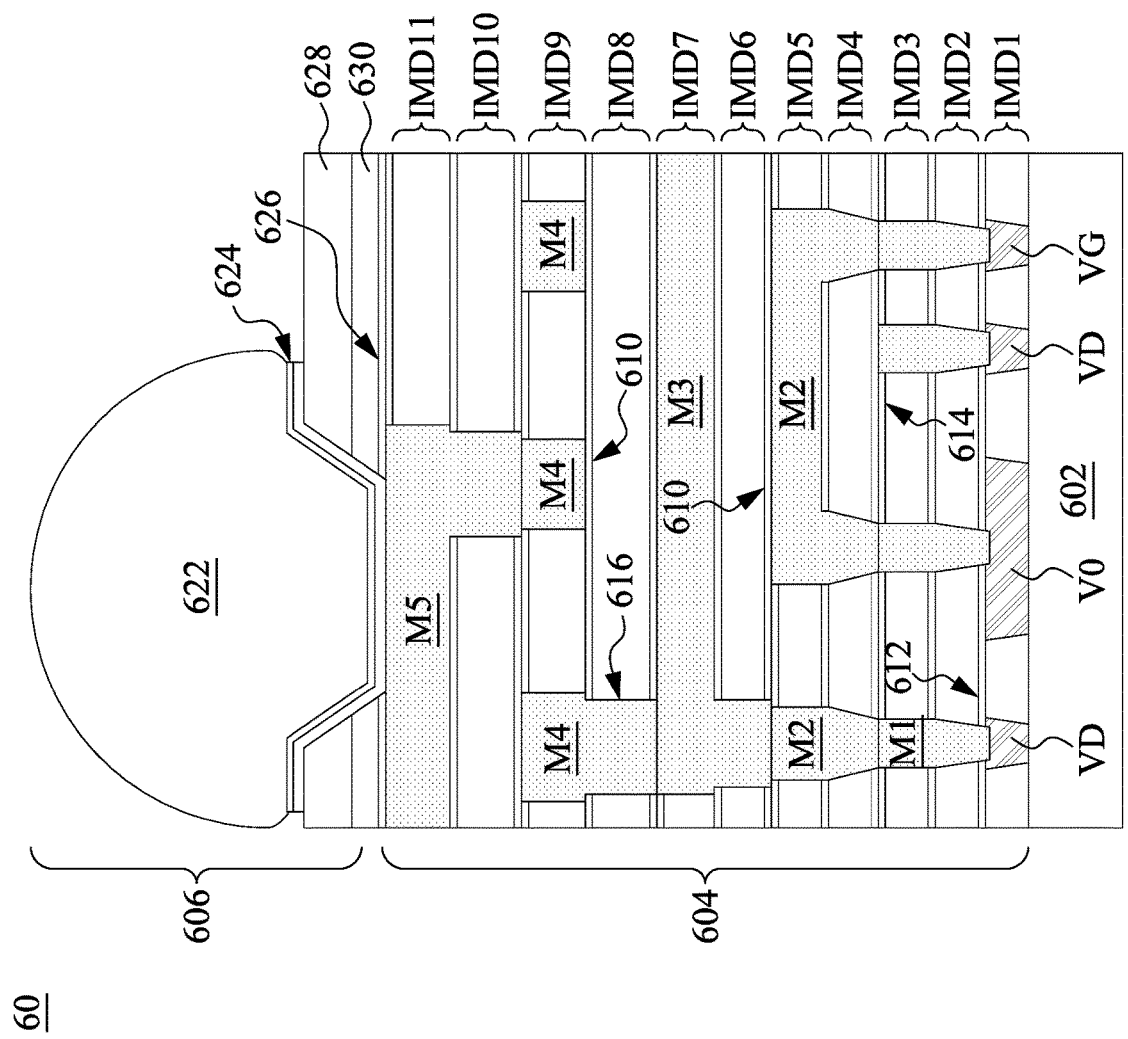
FIG. 21 is a cross-sectional view of a semiconductor device including a semiconductor structure taking along a line II-II' of FIG. 2 according to aspects of the present disclosure.

FIG. 21 is a cross-sectional view of a semiconductor device 60 including a semiconductor structure taking along a line II-II' of FIG. 2 according to aspects of the present disclosure. The semiconductor device 60 may have a semiconductor structure 602 and an interconnect structure 604. Many aspects of the semiconductor structure 602 may be similar to the semiconductor structures 20A, 2013 and 20C as illustrated in FIGS. 3A to 3B, and are hereby omitted from discussion for brevity.

In some embodiments, the interconnect structure 604 includes a plurality of conductive layers labeled M1 through M5. Further, the conductive layers M1 through M5 are disposed in a plurality of inter-metal dielectric layers labeled IMD1 through IMD11. The inter-metal dielectric layers IMD1 through IMD11 may provide electrical insulation as well as structural support for the various features during subsequent fabrication operations. In some embodiments, the conductive layers M1 through M5 can include W, Al, Cu, AlCu, or the like. In some embodiments, the inter-metal dielectric layers IMD1 through IMD11 may be formed of low-k dielectric material. In some embodiments, the inter-metal dielectric layers IMD1 through IMD11 may include spin-on dielectric (SOD), phosphor-silicate glass (PSG), or the like. In some embodiments, the interconnect structure 604 further includes etch stop layers 610, seal layers 612 and oxide layers 614 disposed between the inter-metal dielectric layers IMD1 through IMD11. In some embodiments, the etch stop layers 610 and the seal layers 612 include silicon nitride, silicon carbide, or the like. In some embodiments, the oxide layers 614 include silicon dioxide, or the like. In some embodiments, the interconnect structure 604 further includes barrier layers 616, such as Ta/TaN barrier layers, surrounding the conductive layers M1 through M5.

In some embodiments, the inter-metal dielectric layer IMD1 includes conductive vias, such as gate via VG, drain via VD, and conductive via V0. In some embodiments, the gate via VG may be disposed over the contact layer (not shown) of the semiconductor structure 602. In some embodiments, the gate via. VG directly contacts the contact layer of the semiconductor structure 602.

In some embodiments, the semiconductor device 60 further includes a bonding structure 606. In some embodiments, the bonding structure 606 includes a solder bump 622, a liner 624, a number of seal layers 626 and 628, and a dielectric layer 630. In some embodiments, the solder bump 622 may be lead free. In some embodiments, the liner 624 may include Cr, Cu, Au, or the like. In some embodiments, the seal layers 626 and 628 may include nitride, oxide, or the like. In some embodiments, the dielectric layer 630 may include phosphor-silicate glass (PSG).

The present disclosure provides a semiconductor structure and a method for forming the semiconductor structure. The semiconductor structure includes a substrate having fin structures, and a composite isolation structure disposed between the fin structures. The composite isolation structure comprises a first dielectric material having a first thermal expansion coefficient, and a second dielectric material having a second thermal expansion coefficient. By having the thermal expansion coefficient of the substrate in between the first thermal expansion coefficient and the second thermal expansion coefficient, thermal stress induced by mismatch of thermal expansion of the substrate and the isolation structure can be balanced during an thermal treatment operation such as an annealing process, and thereby the fin structures are not, or at least to a less extent, forced to bend or incline from an original vertical orientation during the thermal treatment operation in the course of manufacturing. Accordingly, the semiconductor structure and the method for forming the semiconductor structure can circumvent the problems caused by the fin bending and consequently the yield and performance of semiconductor devices can be improved.

In some embodiments, a semiconductor structure is provided. The semiconductor structure includes a substrate having fin structures. The substrate includes a material having a substrate thermal expansion coefficient. The semiconductor structure also includes an isolation structure between the fin structures. The isolation structure includes a first dielectric material and a second dielectric material. The first dielectric material has a first thermal expansion coefficient and the second dielectric material has a second thermal expansion coefficient. The substrate thermal expansion coefficient is in between the first thermal expansion coefficient and the second thermal expansion coefficient.

In some embodiments, a semiconductor structure is provided. The semiconductor structure includes a substrate having fin structures. The substrate includes a material having a substrate thermal expansion coefficient. The semiconductor structure includes also includes a first isolation structures and a second isolation structure between the fin structures. The first isolation structure has a first depth and the second isolation structure has a second depth. The first depth is greater than the second depth. The first isolation structure includes a first dielectric material and a second dielectric. The first dielectric material has a first thermal expansion coefficient material and the second dielectric has a second thermal expansion coefficient. The substrate thermal expansion coefficient is in between the first thermal expansion coefficient and the second thermal expansion coefficient.

In some embodiments, a method for forming a semiconductor structure is provided. The method includes the following operations. A substrate is provided. The substrate has fin structures and includes a material having a substrate thermal expansion coefficient. A first dielectric material is formed over the substrate and the fin structures. The first dielectric material has a first thermal expansion coefficient. A second dielectric material is formed over the first dielectric material. The second dielectric material has a second thermal expansion coefficient. The second dielectric material is recessed to form an isolation structure between the fin structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate having fin structures, the substrate comprising a material having a substrate thermal expansion coefficient;
a first isolation structure and a second isolation structure between the fin structures, wherein the first isolation structure has a first tapered surface coupling a bottom surface and a sidewall of the first isolation structure, the second isolation structure has a second tapered surface coupling a bottom surface and a sidewall of the second isolation structure; and
a first dielectric liner sandwiched between the first isolation structure and the substrate and a second dielectric liner sandwiched between the second isolation structure and the substrate, wherein the first dielectric liner and the second dielectric liner comprise a high-k dielectric material,
wherein the first isolation structure and the second isolation structure respectively comprise a first dielectric material having a first thermal expansion coefficient and a second dielectric material having a second thermal expansion coefficient, the first thermal expansion coefficient of the first dielectric material is less than a thermal expansion coefficient of the high-k dielectric material of the first and second dielectric liners, and the first thermal expansion coefficient of the first dielectric material is greater than the second thermal expansion coefficient of the second dielectric material,
wherein the substrate thermal expansion coefficient is in between the first thermal expansion coefficient and the second thermal expansion coefficient,
wherein sidewalls and a bottom of the second dielectric material of the first isolation structure are separated from the first dielectric liner by the first dielectric material of the first isolation structure, and sidewalls and a bottom of the second dielectric material of the second isolation structure are separated from the second dielectric liner by the first dielectric material of the second isolation structure,
wherein the fin structures are exposed from the first dielectric liner and the second dielectric liner, and
wherein a bottommost surface of the first dielectric liner and a bottommost surface of the second dielectric liner are at different levels.

2. The semiconductor structure according to claim 1, wherein the first dielectric material is disposed between the substrate and the second dielectric material.

3. The semiconductor structure according to claim 2, wherein an interface between the first dielectric material and the second dielectric material is concave.

4. The semiconductor structure according to claim 1, wherein the first dielectric material constitutes the sidewalls of the first isolation structure.

5. The semiconductor structure according to claim 1, wherein the first dielectric material has an upper surface coplanar with an upper surface of the second dielectric material.

6. The semiconductor structure according to claim 1, wherein a ratio of a thickness of the first dielectric material to a thickness of the second dielectric material is between 0.1 and 10.

7. The semiconductor structure according to claim 1, wherein the first dielectric liner and the second dielectric liner are in direct physical contact with the substrate.

8. The semiconductor structure according to claim 1, wherein the first dielectric material constitutes the bottom and the sidewalls of the second isolation structure.

9. The semiconductor structure according to claim 1, wherein a first depth of the first isolation structure is greater than a second depth of the second isolation structure.

10. The semiconductor structure according to claim 1, wherein a width of a top surface of the first isolation structure is greater than a width of a top surface of the second isolation structure.

11. The semiconductor structure according to claim 1, wherein a width of a bottom surface of the first isolation structure is greater than a width of a bottom surface of the second isolation structure.

12. The semiconductor structure according to claim 1, wherein the first dielectric material of the first isolation structure has an U shape, and the first dielectric material of the second isolation structure has an U shape.

13. A semiconductor structure, comprising:
a substrate having fin structures, the substrate comprising a material having a substrate thermal expansion coefficient;
a first isolation structure and a second isolation structure between the fin structures, the first isolation structure having a first depth measured from a topmost surface to a bottommost surface of the first isolation structure, and the second isolation structure having a second depth measured from a topmost surface to a bottommost surface of the second isolation structure, wherein the first depth is greater than the second depth; and
a liner sandwiched between the first and second isolation structures and the substrate and between the first and second isolation structures and the fin structures, wherein the liner comprises a high-k dielectric material,
wherein the first isolation structure comprises a first dielectric material having a first thermal expansion coefficient and a second dielectric material having a second thermal expansion coefficient, the first thermal expansion coefficient of the first dielectric material is less than a thermal expansion coefficient of the high-k dielectric material of the liner, and the first thermal expansion coefficient of the first dielectric material is greater than the second thermal expansion coefficient of the second dielectric material,
wherein the second isolation structure comprises the first dielectric material and the second dielectric material,
wherein the substrate thermal expansion coefficient is in between the first thermal expansion coefficient and the second thermal expansion coefficient,
wherein the first isolation structure has a first tapered surface coupling a bottom surface and a sidewall of the first isolation structure, the second isolation structure has a second tapered surface coupling a bottom surface and a sidewall of the second isolation structure, wherein sidewalls and a bottom of the second dielectric material of the first isolation structure are separated from the liner by the first dielectric material of the first isolation structure, and sidewalls and a bottom of the second dielectric material of the second isolation structure are separated from the liner by the first dielectric material of the second isolation structure, and wherein the fin structures are exposed from the liner.

14. The semiconductor structure according to claim 13, wherein the first dielectric material is disposed between the substrate and the second dielectric material.

15. The semiconductor structure according to claim 13, wherein a ratio of a thickness of the first dielectric material to a thickness of the second dielectric material is between 0.1 and 10.

16. The semiconductor structure according to claim 13, wherein the liner is in direct physical contact with the substrate and the first dielectric material.

17. A semiconductor structure, comprising:
a substrate having fin structures, the substrate comprising a material having a substrate thermal expansion coefficient;
a first isolation structure and a second isolation structure between the fin structures, the first isolation structure having a first width and the second isolation structure having a second width, wherein the first width is greater than the second width, the first isolation structure has a first tapered surface coupling a bottom surface and a sidewall of the first isolation structure, the second isolation structure has a second tapered surface coupling a bottom surface and a sidewall of the second isolation structure; and
a first dielectric liner sandwiched between the first isolation structure and the substrate, and a second dielectric liner sandwiched between and second isolation structure and the substrate, wherein the first dielectric liner and the second dielectric liner comprise a high-k dielectric material,
wherein the first isolation structure comprises a first dielectric material having a first thermal expansion coefficient and a second dielectric material having a second thermal expansion coefficient, the first thermal expansion coefficient of the first dielectric material is less than a thermal expansion coefficient of the high-k dielectric material of the first and second dielectric liners, and the first thermal expansion coefficient of the first dielectric material is greater than the second thermal expansion coefficient of the second dielectric material, wherein the second isolation structure comprises the first dielectric material and the second dielectric material, the first dielectric material is sandwiched between the second dielectric material and the substrate, wherein the substrate thermal expansion coefficient is in between the first thermal expansion coefficient and the second thermal expansion coefficient, wherein sidewalls and a bottom of the second dielectric material of the first isolation structure are separated from the first dielectric liner by the first dielectric material of the first isolation structure, and sidewalls and a bottom of the second dielectric material of the second isolation structure are separated from the second dielectric liner by the first dielectric material of the second isolation structure, wherein the fin structures are exposed from the first dielectric liner and the second dielectric liner, and wherein a bottommost surface of the first dielectric liner and a bottommost surface of the second dielectric liner are at different levels.

18. The semiconductor structure according to claim 17, wherein the first dielectric liner and the second dielectric liner abut the substrate and the first dielectric material.

19. The semiconductor structure according to claim 17, wherein the first dielectric material has an upper surface coplanar with an upper surface of the first dielectric liner and the second dielectric liner.

20. The semiconductor structure according to claim 17, wherein the first isolation structure has a first depth, the second isolation structure has a second depth, and the first depth is greater than the second depth.

* * * * *